United States Patent [19]
Joyce

[11] Patent Number: 6,061,638
[45] Date of Patent: May 9, 2000

[54] MICROPROCESSOR-BASED BATTERY TESTER SYSTEM

[75] Inventor: Timothy D. Joyce, Spanish Fort, Utah

[73] Assignee: Auto Meter Products, Inc., Sycamore, Ill.

[21] Appl. No.: 08/903,857

[22] Filed: Jul. 30, 1997

[51] Int. Cl.[7] .................................................. G01N 27/416
[52] U.S. Cl. ............................................. 702/63; 340/636
[58] Field of Search ............................... 702/63, 85, 107; 340/636; 324/426, 429, 427

[56] References Cited

U.S. PATENT DOCUMENTS

| | | | |
|---|---|---|---|
| 3,593,099 | 7/1971 | Scoll | 320/13 |
| 3,676,770 | 7/1972 | Sharaf et al. | 324/29.5 |
| 3,873,911 | 3/1975 | Champlin | 324/29.5 |
| 3,886,443 | 5/1975 | Miyakawa et al. | 324/29.5 |
| 3,906,329 | 9/1975 | Bader | 320/44 |
| 3,909,708 | 9/1975 | Champlin | 324/29.5 |
| 3,984,768 | 10/1976 | Staples | 324/62 |
| 4,126,874 | 11/1978 | Suzuki et al. | 354/60 |
| 4,193,025 | 3/1980 | Frailing et al. | 324/427 |
| 4,408,157 | 10/1983 | Beaubien | 324/62 |
| 4,423,378 | 12/1983 | Marino et al. | 324/427 |
| 4,679,000 | 7/1987 | Clark | 324/428 |
| 4,697,134 | 9/1987 | Burkum et al. | 320/48 |
| 4,710,861 | 12/1987 | Kanner | 363/46 |
| 4,719,428 | 1/1988 | Liebermann | 324/436 |
| 4,740,905 | 4/1988 | Murakami et al. | 364/571 |
| 4,816,768 | 3/1989 | Champlin | 324/428 |
| 4,825,170 | 4/1989 | Champlin | 324/436 |
| 4,881,038 | 11/1989 | Champlin | 324/426 |
| 4,912,416 | 3/1990 | Champlin | 324/430 |
| 4,929,931 | 5/1990 | McCuen | 340/636 |
| 4,968,941 | 11/1990 | Rogers | 324/428 |
| 5,010,889 | 4/1991 | Bredesen et al. | 128/715 |
| 5,047,722 | 9/1991 | Wurst et al. | 324/430 |
| 5,254,952 | 10/1993 | Salley et al. | 324/429 |
| 5,343,380 | 8/1994 | Champlin | 363/46 |
| 5,572,136 | 11/1996 | Champlin | 324/426 |
| 5,744,962 | 4/1998 | Alber et al. | 324/426 |

FOREIGN PATENT DOCUMENTS

| | | | |
|---|---|---|---|
| WO 93/22667 | 11/1993 | WIPO | 27/416 |
| WO 96/05508 | 2/1996 | WIPO | 27/416 |

OTHER PUBLICATIONS

Professional Battery Test Equipment Brochure, Auto Meter Products, Inc., 1995 (8 pages).

Feder et al., Updated Status of Conductance/Capacity Correlation Studies to Determine the State-of-Health of Automotive SLI and Stand-by Lead Acid Batteries, Midtronics, Paper Presented to Zinc and Lead Asian Service, ZALAS, 5th Asian Battery Conference 1993 (18 pages).

*Primary Examiner*—Marc S. Hoff
*Assistant Examiner*—Linh Nguyen
*Attorney, Agent, or Firm*—Arnold, White & Durkee

[57] ABSTRACT

A system for determining the operating characteristics of an energy source. The system comprises controller means for generating and shaping a time-varying voltage signal for application to the energy source; conversion means for receiving from the energy source a time-varying return voltage signal and for converting the time-varying return voltage signal into a digital signal. The amplitude of the time-varying return signal contains information representative of the operating characteristics of the energy source. The time-varying return voltage signal is produced in response to the time-varying voltage signal. The controller means is responsive to the digital signal and determines the operating characteristics of the energy source. The controller means generates display signals, and the display signals are representative of the operating characteristics of the energy source. The system also comprises display means for displaying the display signals.

19 Claims, 26 Drawing Sheets

BRAND STORE INC.
1234 TELESCOPE RD.
LONG ROOT IN. 88888
LOCATION #
BATTERY SERVICE AND WARRANTY CLAIM FORM

BATTERY INFORMATION
DATE OF PURCHASE:
TODAYS DATE:
MONTHS IN SERVICE:
STOCK #:
RATING:             C.C.A.   C.A.   AMP HRS.

WARRANTY INFORMATION:
NEW REPLACEMENT COST:
MONTHS IN SERVICE:
WARRANTY CREDIT:
NET DUE:
TAX:
TOTAL DUE:

CUSTOMER INFORMATION
NAME:
ADDRESS:

PHONE:
COMMENTS:

BATTERY TEST RESULTS

CUSTOMER RECOMMENDATION

REMOVABLE DECAL    REMOVABLE DECAL

TEST RESULTS    TEST RESULTS

PLACE ON BATTERY    PLACE ON BATTERY

☐ RETURN TO SERVICE

ABC PRODUCTS, INC.
967 W. ROSE AVE
PARRNELL, VA 88922

| Voltage | Result |
|---|---|
| 0 to 4.00 | Tester will not power up. |
| 4.10 to 5.69 | Bad cell. |
| 5.70 to 6.40 | Testable 6 volt battery. |
| 6.41 to 6.80 | Sulfated or surface charged 6 volt battery. |
| 6.81 to 11.39 | Bad cell. |
| 11.40 to 13.00 | Testable 12 volt battery. |
| 13.01 to 13.60 | Sulfated or surface charged 12 volt battery. |
| 13.61 to 22.79 | Bad cell. |
| 22.8 to 26.0 | Testable 24 volt battery. |
| 26.1 to 27.2 | Sulfated or surface charged 24 volt battery. |

*TABLE 1*

| Temperature | Maximum Voltage Drop | M(T) |
|---|---|---|
| 70° F | 3.60 | 1.000 |
| 60° F | 3.67 | 0.981 |
| 50° F | 3.73 | 0.965 |
| 40° F | 3.80 | 0.947 |
| 30° F | 3.93 | 0.916 |
| 20° F | 4.07 | 0.885 |
| 10° F | 4.20 | 0.857 |
| 0° F | 4.33 | 0.831 |

*TABLE 2*

| Battery Voltage (V) | Resistance (mOhms) | M (c) |
|---|---|---|
| 12.69 | 3.30 | 1.00 |
| 12.64 | 3.38 | 0.98 |
| 12.55 | 3.46 | 0.95 |
| 12.45 | 3.70 | 0.89 |
| 12.30 | 4.16 | 0.79 |
| 12.24 | 4.32 | 0.76 |
| 12.06 | 4.72 | 0.70 |
| 11.93 | 5.12 | 0.64 |
| 11.82 | 5.36 | 0.62 |
| 11.71 | 5.84 | 0.57 |
| 11.65 | 6.08 | 0.54 |
| 11.57 | 7.12 | 0.46 |
| 11.39 | 9.40 | 0.35 |

*TABLE 3*

| Voltage | Charge Level (%) | Charge Level (Scale) |
|---------|------------------|----------------------|
| 12.68   | 100%             | Full                 |
| 12.45   | 75%              | 3/4                  |
| 12.24   | 50%              | 1/2                  |
| 12.06   | 25%              | 1/4                  |
| 11.89   | 0%               | Empty                |

*TABLE 4*

MICROPROCESSOR-BASED BATTERY TESTER SYSTEM

FIELD OF INVENTION

The invention relates generally to systems for testing the conditions of batteries. In particular, the invention relates to battery testers that use a microprocessor to initiate and shape a waveform which is sent to a battery. Subsequently, a returning waveform from the battery is sampled by the microprocessor which determines operating characteristics of the battery from the amplitude of the returning waveform.

BACKGROUND

The following symbols will have the following meanings in the description of the preferred battery testing system embodying this invention:

I(full) Maximum current applied to battery.

M(t) Multiplier to adjust current down for a lower battery temperature.

M(c) Multiplier to adjust current down for a lower battery charge.

I(adj) Equal to I(full) times M(t) times M(c).

R(adj) Battery resistance adjusted to full charge and 70° F.

R(bat) The actual resistance of the battery.

CCA Cold Cranking Amps of a fully charged battery.

V(d) Voltage drop across the battery due to an internal resistance and an applied current.

CA Cranking Amps, the current that the battery can supply for 30 seconds at full charge and at 70° F. and not drop the battery voltage below 1.2 volts per cell.

AA Available Amps, the current the battery can supply for 30 seconds at the actual charge and temperature and not drop the battery voltage below 1.2 volts per cell.

AH Amp Hours, the current in amperes times the number of hours to discharge.

V(bat) The terminal voltage of the battery.

Cold Cranking Amps (CCA) are defined by the Battery Council International (BCI) as "the number of amperes a battery at 0° F. (−17.8° C.) can deliver for 30 seconds and maintain, at least, a voltage of 1.2 volts per cell (lead-acid)". For example, a 12-volt lead-acid battery having 6 cells with 1.2 volts/cell must not drop below 7.2 volts. A fully charged battery has an open circuit voltage of 12.6 volts. The voltage drop from 12.6 volts to 7.2 volts is 5.4 volts. Therefore, at 0° F., the CCA of the battery is the current that the battery can supply and drop the voltage not more that 5.4 volts at the end of 30 seconds. For a 6-volt lead-acid battery, the maximum drop is 2.7 volts and for a 24-volt lead-acid battery, the maximum drop is 10.8 volts.

Using Ohm's law, the CCA is 5.4/R for a 12-volt battery 2.7/R for a 6-volt battery, and 10.8/R for a 24-volt battery, where R is the internal resistance of the battery.

The BCI CCA test is performed with a high amount of current for a long period of time (30 seconds) and at 0° F. The battery's resistance changes over time throughout the 30-second test as the battery's charge is reduced. Therefore, if a small signal measurement of the battery's resistance is made and at a higher temperature, adjustments to the above formulas would have to be made. Experimental data shows that this adjustment is made by multiplying the constants in the above formulas by approximately two-thirds to give a CCA of 3.6/R for a 12-volt battery, 1.8/R for a 6-volt battery, 7.2/R for a 24-volt battery, were R is the internal resistance of the battery adjusted to approximately 70° F. and full charge.

SUMMARY OF THE INVENTION

It is an object of the invention to provide a battery testing system that uses a microprocessor to perform battery test measurements.

A further object of the invention is to provide a testing system which corrects the test waveform before the waveform is sent to the battery.

Still another object of the invention is to use a microprocessor to determine the battery's resistance, operating parameters, and condition from an evaluation of the returning waveform from the battery.

Yet another object of the invention is to provide a system which is easy to maintain and use.

In accordance with the present invention, the foregoing objectives are realized by a system for determining the operating characteristics of a battery, said system comprising: a battery; controller means for generating and shaping a time-varying voltage signal for application to said battery; conversion means for receiving from said battery a time-varying return voltage signal and for converting said time-varying return voltage signal into a digital signal, the amplitude of said time-varying return signal containing information representative of the operating characteristics of said battery, said time-varying return voltage signal being produced in response to said time-varying voltage signal; said controller means being responsive to said digital signal for determining the operating characteristics of said battery, said controller means generating display signals, said display signals representative of the operating characteristics of said battery; and display means for displaying said display signals.

BRIEF DESCRIPTION OF THE DRAWINGS

FIG. 8n illustrates the warranty printout slip according to principles of the present invention;

TABLE 1 is a table of voltage ranges and results of the cell test according to principles of the present invention;

TABLE 2 is a table of the multiplier M(t) according to principles of the present invention;

TABLE 3 is a table of dates collected from a 1000 CCA battery with multiplier data according to principles of the present invention; and TABLE 4 is a table relating state of charge to terminal voltage for a 12-volt battery according to principles of the present invention.

DESCRIPTION OF THE PREFERRED EMBODIMENT

Several illustrative embodiments of a battery tester are described below as they might be implemented to provide for improved methods of determining the operating conditions of a battery.

The battery tester uses small signal analysis to measure the internal resistance of single and multiple cell 6, 12 and 24-volt lead-acid batteries and to determine the condition of the batteries based on the internal resistance, level of charge, and the temperature of the batteries.

To determine the condition of a battery, the tester measures the battery's unloaded voltage and then adjusts the sinusoidal current signal for state of charge and temperature. The tester applies the adjusted sinusoidal signal to the battery and measures the adjusted internal resistance of battery. This adjusted internal resistance is divided into a predetermined constant to determine the battery's CCA at full charge.

A low current sinusoidal signal is used for two reasons. First, the low current sinusoidal signal minimizes the destabilizing effect of performing the test on the battery. Second, the sinusoidal signal allows the voltage drop on the battery to be AC coupled which isolates it from the DC components and facilitates measuring and amplifying such a small signal. The battery's unadjusted internal resistance is computed and entered into a formula to compute the battery's actual available current at its actual state of charge and temperature.

Figure 1:
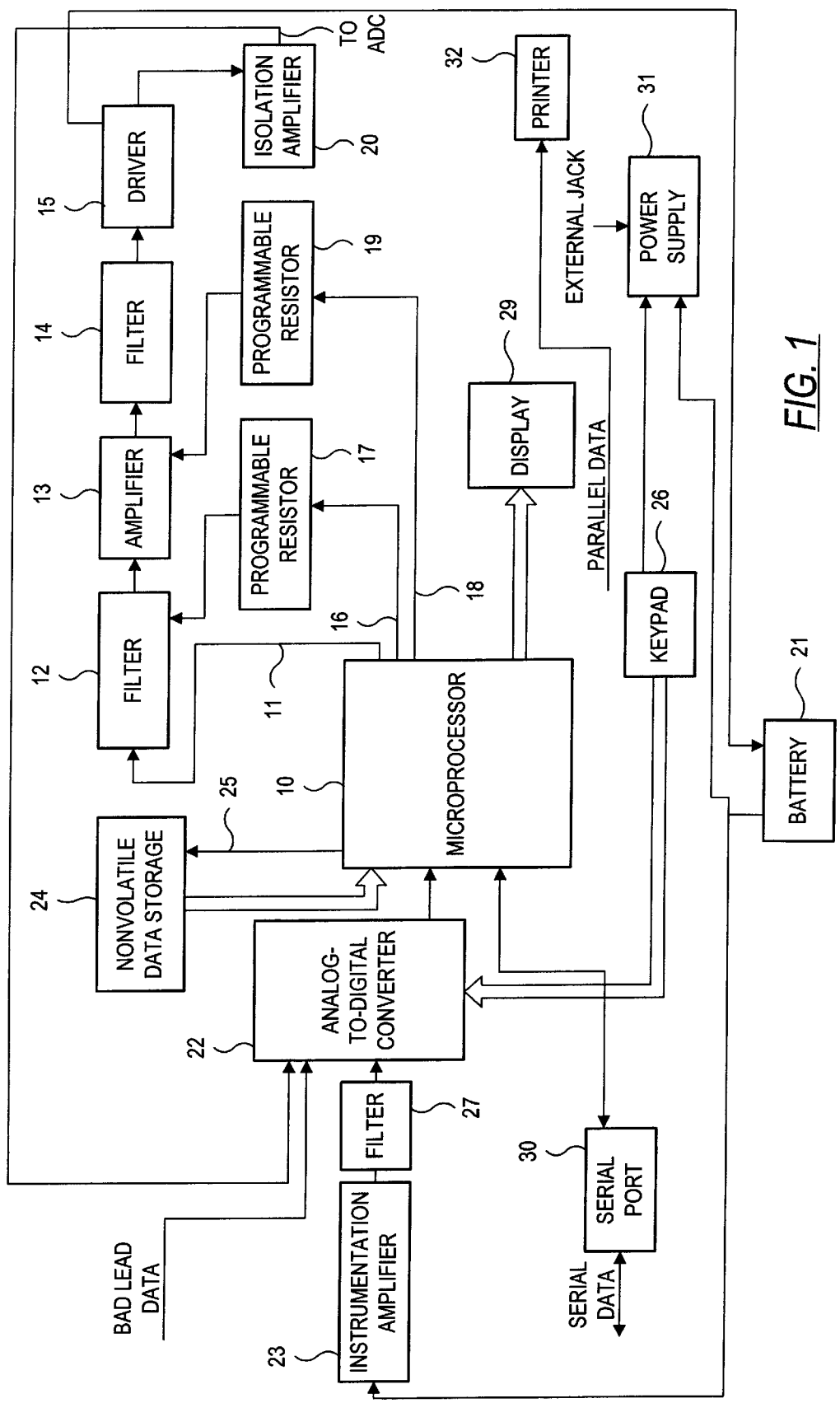
FIG. 1 is a block diagram of the battery testing system according to principles of the present invention.
Figure 2:
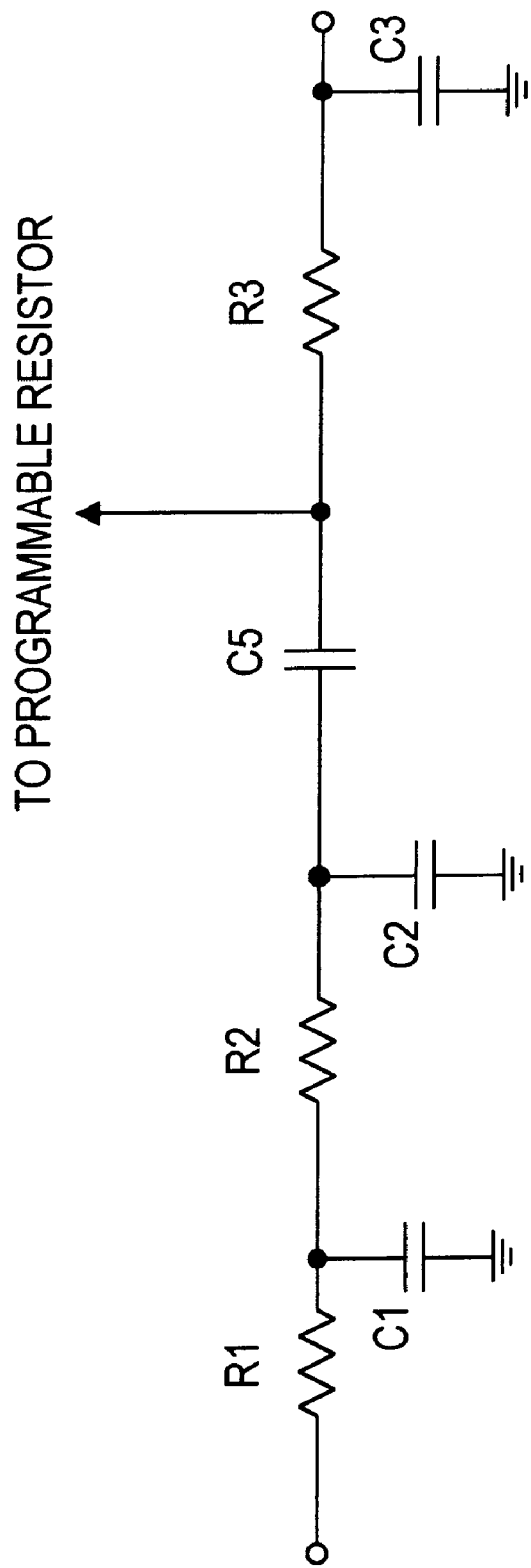
FIG. 2 is a circuit diagram of a passive filter according to principles of the present invention.

Referring now to FIG. 1, a microprocessor 10 outputs a series of digital interrupts at a frequency of 60 Hz over an output line 11. The output line 11 is connected to the input of a filter 12. As shown in detail in FIG. 2, the filter 12 comprises resistor R1 and C1, resistor R2 and C2, and resistor R3 and C3. A capacitor C5 AC couples stages of the filter 12 together. The filter 12 converts the square-wave output of the microprocessor 10 into a sinusoidal waveform. A first programmable resistor 17 is coupled to the input of R3 which controls the DC offset at the output of the filter 12. The value of the programmable resistor 17 is controlled by microprocessor 10 through a control line 16.

Referring once again to FIG. 1, the sinusoidal waveform produced by the filter 12 is transmitted to an amplifier 13. The amplifier 13 is connected to the output of filter 12 and provides an adjustable amplification factor to the sinusoidal waveform produced by the filter 12. The amplifier 13 is also coupled to a second programmable resistor 19 which adjusts the gain of the amplifier. The value of the programmable resistor 19 is controlled by a control line 18 from the microprocessor 10, which alters the value of the second programmable resistor 19 to change the amplitude of the sinusoidal waveform. The amplitude of the sinusoidal waveform is adjusted, as will be explained in greater detail below, to take into account the battery's temperature and state of charge.

The amplifier output is coupled to a filter 14, which is a passive filter of a type well-known in the art. The purpose of the filter 14 is to further smooth out the waveform present at the output of the amplifier 13, producing a sinusoidal waveform.

The filter 14 is connected to a driver 15 which amplifies the signal to supply a current signal of sufficient strength to a battery 21. Preferably, this current signal will have a magnitude of around 1 amp. The output of the driver 15 is also fed back to the microprocessor 10 through an isolation amplifier 20 via an analog-to-digital converter 22 in order that the signal sent to the battery 21 can be properly calibrated. That is, the microprocessor 10 monitors the signal level at the output of driver 15 to ensure that the signal level sent to the battery 21 matches the value of the signal the microprocessor has required be sent to the battery (which takes into account the battery's temperature and state of charge).

Figure 3:
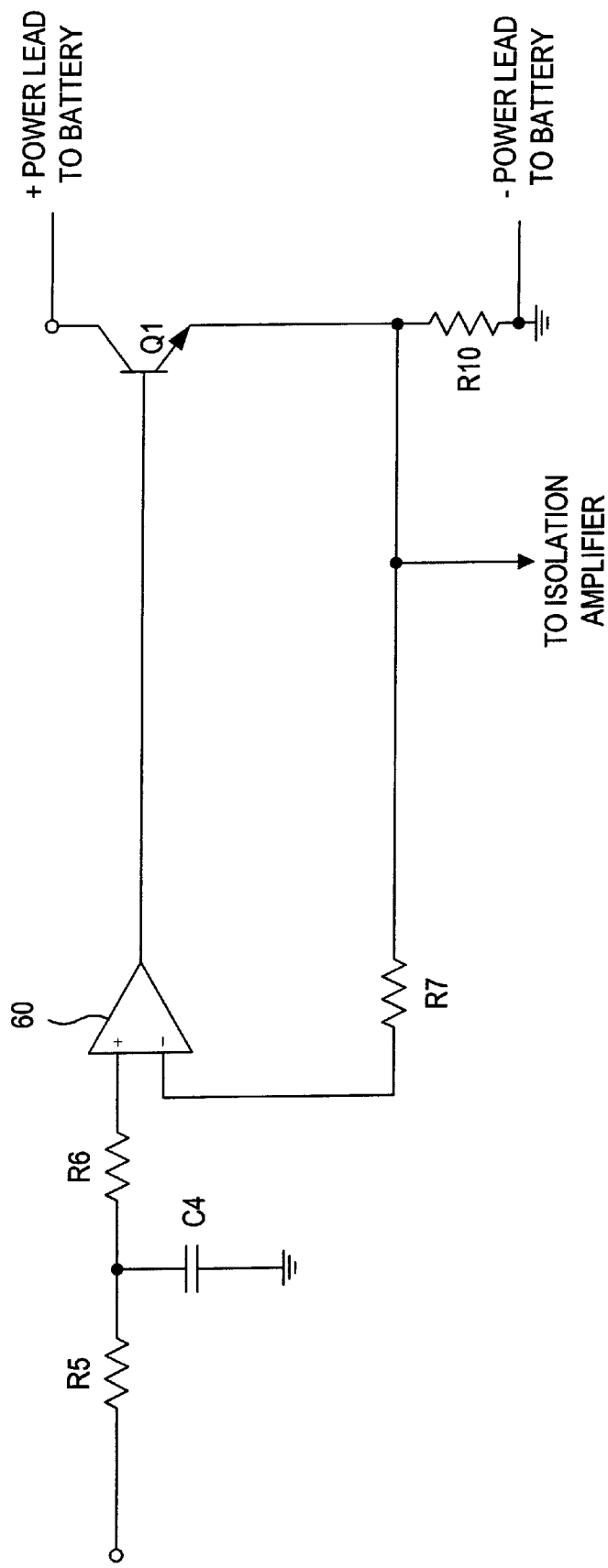
FIG. 3 is a circuit diagram of a driver circuit according to principles of the present invention.

One embodiment of the driver amplifier 15 is illustrated in FIG. 3. The sinusoidal signal is input through a passive filter which is comprised of a resistor R5 and capacitor C4 which further smooth the waveform. The resulting signal is the input to an operational amplifier 60, configured as an emitter follower through resistor R6. The operational amplifier 60 has a resistor R7 connected between the input to R10 and the inverting input terminal to provide regulation of the input of R10 equal to the input of R6. The output of the operational amplifier 60 is coupled to the base of a transistor Q1, which is used to draw the necessary current from the battery 21 through the power leads. A resistor R10 is connected between the emitter of Q1 and ground. As described above, the microprocessor 10 monitors the current waveform present across resistor R10 and makes appropriate adjustments to the amplitude of the waveform through the second programmable resistor 19 to ensure that the expected value of the output of the amplifier 15 matches the actual, required value.

Referring again to FIG. 1, the output of the driver 15 is connected to an isolation amplifier 20 which provides isolation between the analog-to-digital converter 22 and the output of the driver 15. The isolation amplifier 20 also amplifies the sinusoidal waveform and is comprised of op-amp circuits providing fixed amplifications which are well-known to those skilled in the art.

Referring again to FIG. 1, the output of the isolation amplifier 20 is transmitted to the analog-to-digital converter 22. Thereafter, a sinusoidal signal with an amplitude proportional to the battery's internal resistance returns to an input amplifier 23 from the battery 21 via the sense leads. This result is based on the well-known principle that an unknown resistance can be determined by injecting a known current across the unknown resistance and observing the resulting voltage across the unknown resistance. Additionally, since the input signal to the battery has already been calibrated, as described above, the returning signal will already have any needed corrections for battery temperature and for the battery's state of charge.

Figure 4:
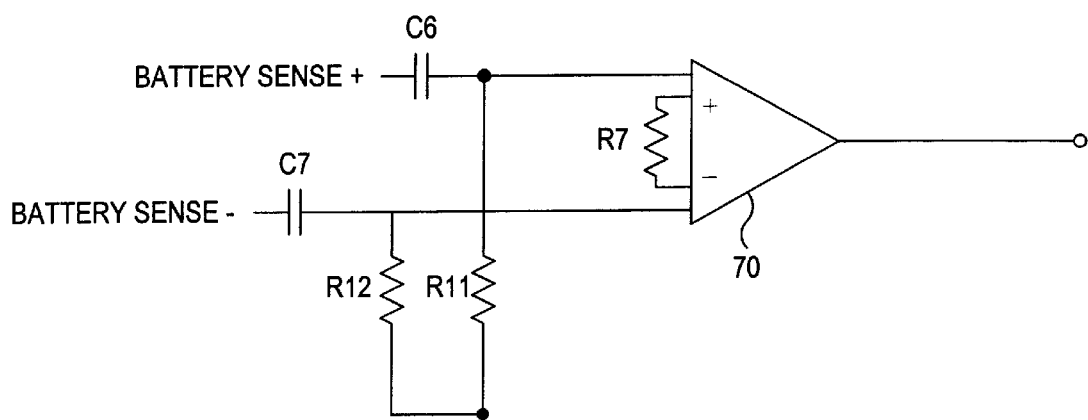
FIG. 4 is a circuit diagram of an instrumentation amplifier according to principles of the present invention.

The returning signal is an AC sinusoidal waveform, and this returning signal is amplified by an instrumentation amplifier 23. Referring now to FIG. 4, the instrumentation amplifier comprises an operational amplifier 70, resistors R11, R12 (for referencing), and capacitors C6 and C7. R7 establishes the correct gain. The DC element of the sinusoidal waveform present at the input of instrumentation amplifier 23 is blocked by capacitors C6 and C7. After removal of the DC component of the sinusoidal waveform, the remaining AC portion, present at the output of the operational amplifier 70, represents the resistance of the battery.

Referring again to FIG. 1, the AC portion of the sinusoidal waveform at the output of the instrumentation amplifier 23 is focused through a filter 27 and converted by the analog-to-digital converter 22 into a digital signal. This digital signal is subsequently transmitted from the analog-to-digital converter 22 to the microprocessor 10 for evaluation. The microprocessor 10 uses DSP processes to filter out noise and determine the battery's resistance. The resistance is then used to determine the cold cranked ampere (CCA) rating of the battery as well as the battery's condition. The analog-to-digital converter 22 also receives bad lead data which the microprocessor 10 uses to determine whether the battery 21 has been properly connected. The microprocessor 10 monitors the voltage across the sense leads in the battery 21. A value of more than 4 volts or less than 2.5 volts indicates that either lead of the connector to the battery is unconnected.

The microprocessor 10 is connected to nonvolatile data storage 24. The nonvolatile data storage 24 is used to retain data in the system when the power is removed from the tester and stores information such as the current CCA and battery temperature settings. A control line or lines 25 are used by the microprocessor to load date into, and retrieve data from, the nonvolatile data storage. Although only one nonvolatile storage unit is shown, it will be understood that any number of such units can be included.

The microprocessor 10 receives data entered on a keypad 26. As will be explained in greater detail below, this data indicates the battery's temperature, the battery's CCA, CA or AH or stock number rating, and whether the user desires a test. The data from the keypad 26 proceeds to the microprocessor 10 via the analog-to-digital counter 22. Alternatively, three-position switches could be used instead of a keypad to adjust the temperature and CCA settings. Also, a momentary switch could be used in place of the keypad to indicate whether the user desires a test. If a momentary switch is used, when pushed by a user, the switch indicates to the microprocessor 10 that the user desires a test be made. The output of the momentary switch is connected to the analog-to-digital converter 22. The microprocessor 10 reads the value present at the input of the analog-to-digital converter 22 when determining whether a test is to be conducted.

The printer 32 prints data "pro-rated" for the battery's warranty and length of service. The warranty information includes the length of the warranty in months, the number of months the battery has been in service and the purchase price of the battery. A warranty proration curve is custom programmed into the system as requested by the purchaser of the tester. For example, if a battery store uses a linear proration curve and a customer brings in a battery after 24 months that costs $70.00 and has a 60-month warranty, then the tester computes the credit for the battery to be $70.00 minus $70.00 times 24/60 or $42.00. The microprocessor 10 then takes the purchase price and subtracts the credit and computes and adds the sales tax to give the cost due from the customer for the new battery.

Figure 8A:
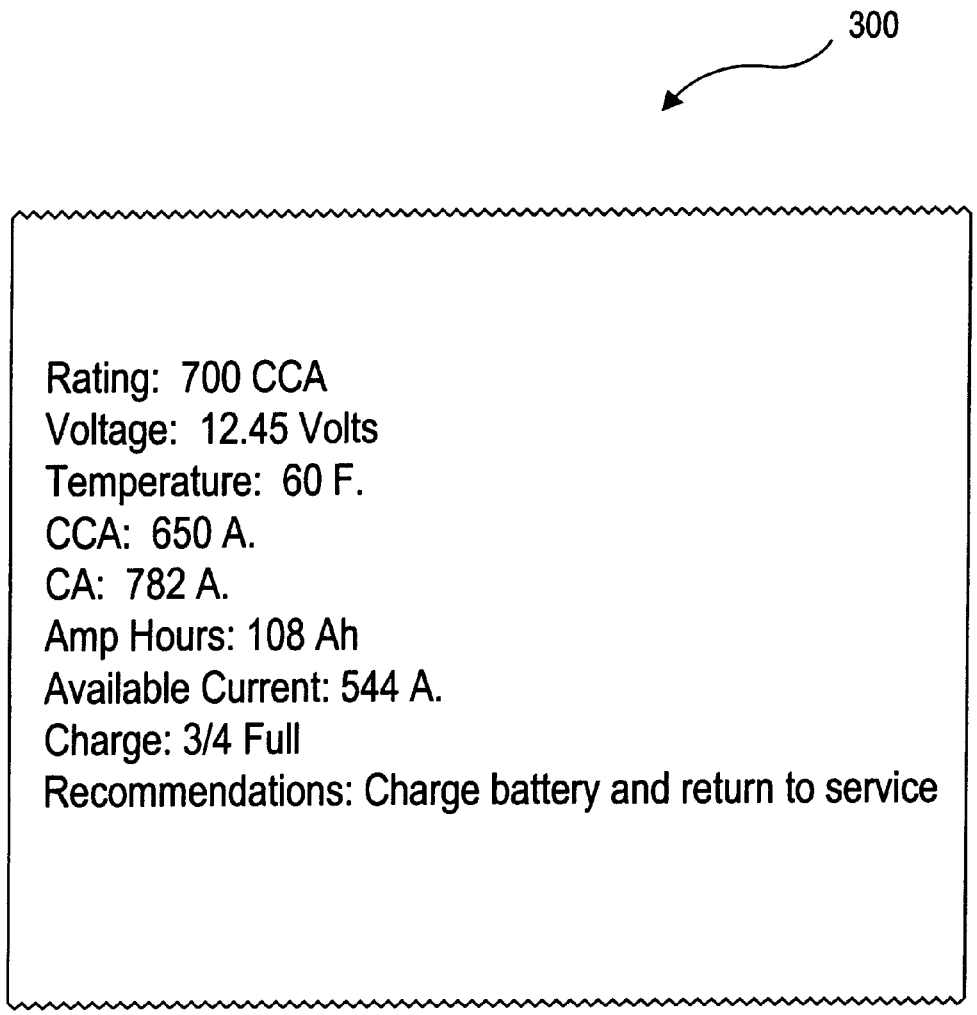
FIG. 8a is a diagram of a printout according to principles of the present invention.

Two types of printers may be used in conjunction with the tester, a cash register receipt-type and a full-size (9 or 24) dot hammer invoice-type printer. The cash register receipt-type printer prints the test results as illustrated in FIG. 8a. A receipt 300 includes the rating of the battery, the voltage of the battery, temperature, CCA, CA, amp hours CAA, available current state of charge, and recommendations.

The full-size printer prints the same information plus the warranty information on a custom form with decals that can be removed and attached to the battery for tracking purposes.

A display 29 is connected to the microprocessor 10. The display 29 is preferably a 128 by 128 dot matrix graphic display as is known in the art. The microprocessor 10 communicates battery information to the user of the tester such as the battery's CCA, the battery's voltage, the battery's condition, instructional prompts, and the current settings of the battery temperature and the battery CCA rating. The microprocessor 10 may be connected to the printer 32 via a parallel port. A parallel printer cable may also be connected to the microprocessor that allows the tester to send data to the printer 32 or to a computer.

Figure 8B:
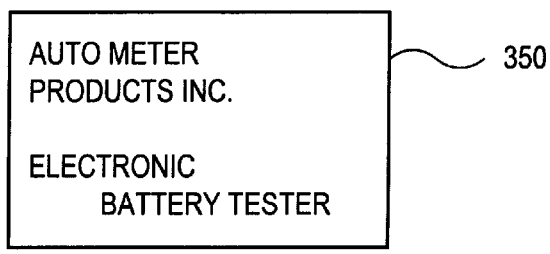
FIGS. 8b–8m illustrate screens of the display according to principles of the present invention.
Figure 8C:
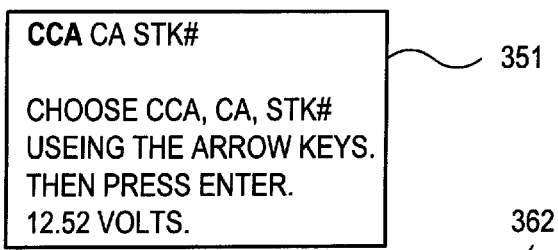
Figure 8D:
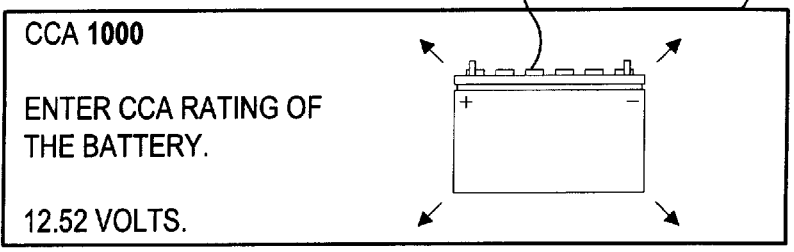
Figure 8E:
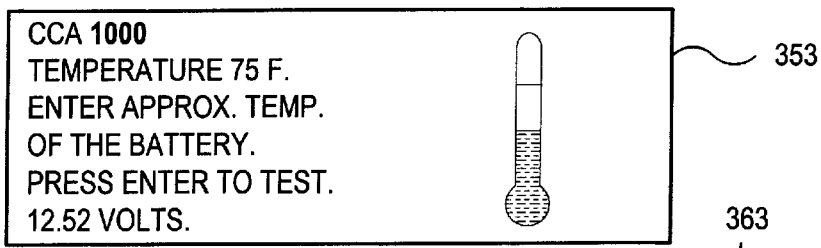
Figure 8F:
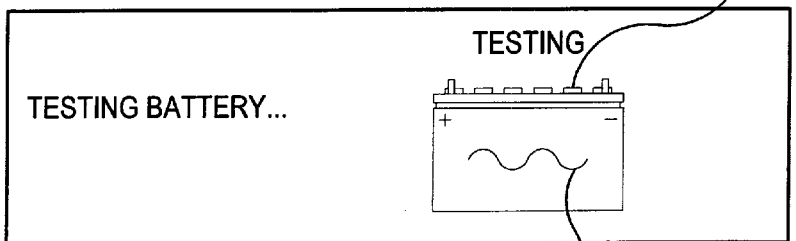
Figure 8G:
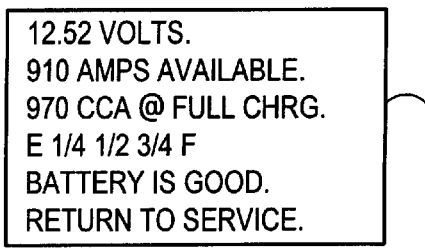
Figure 8H:
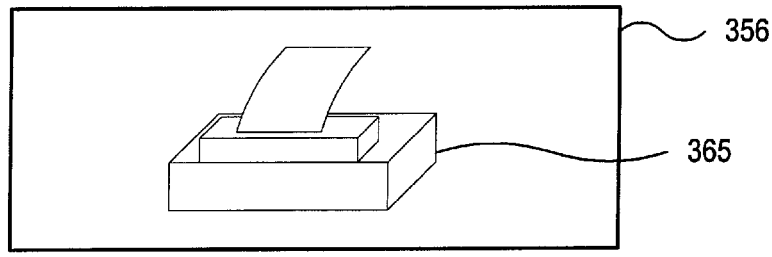
Figures 8I, 8J:
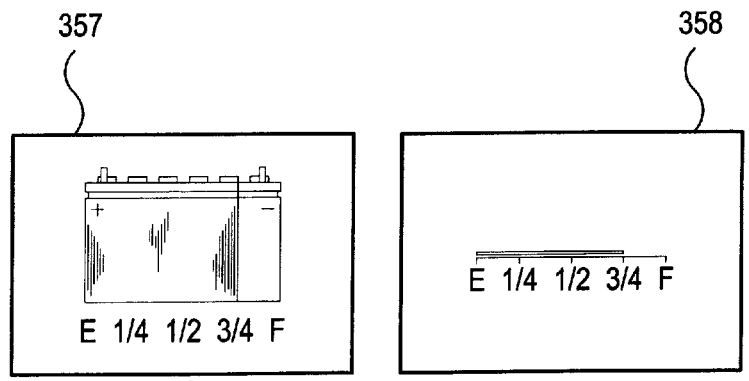
Figure 8K:
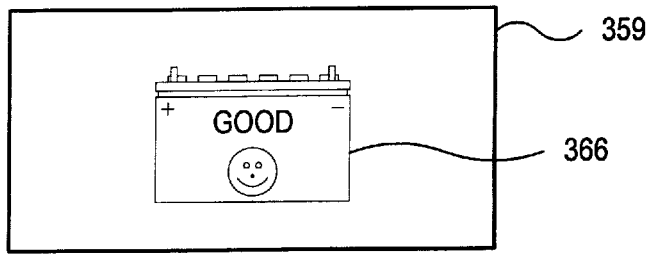
Figures 8L, 8M:
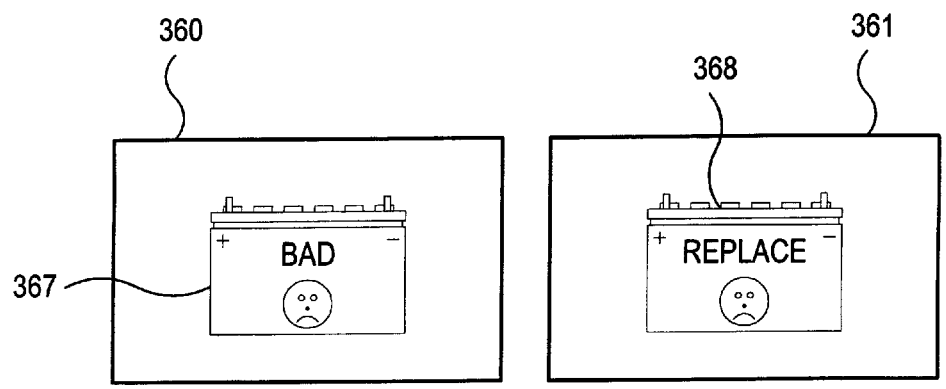
Figure 9:
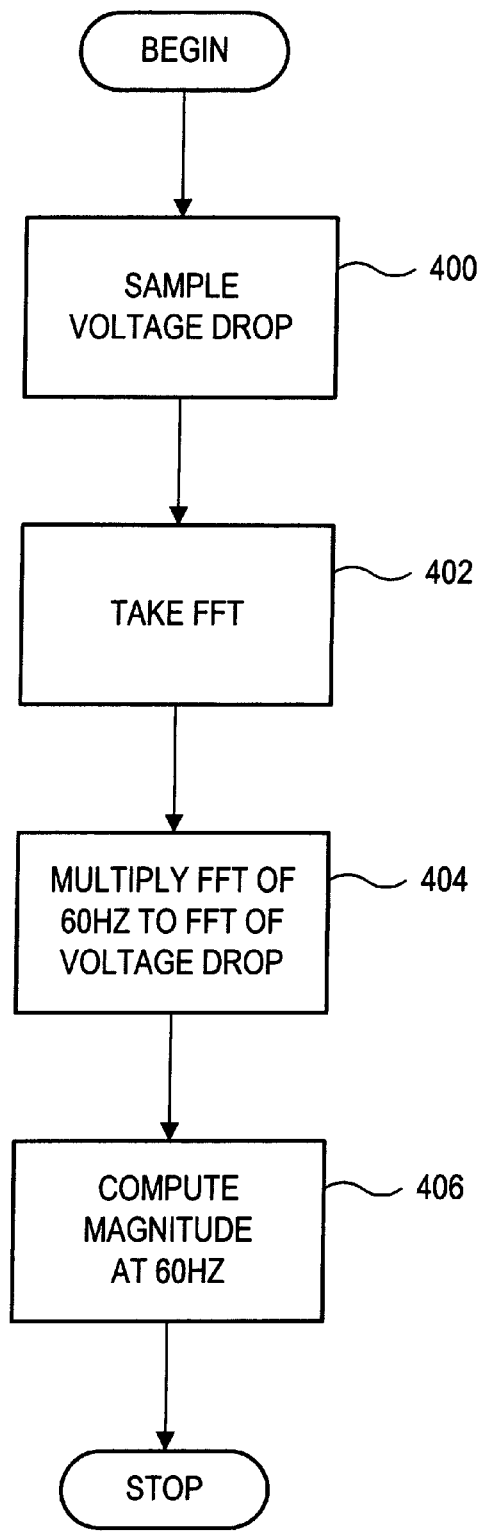
FIG. 9 illustrates a DSP algorithm for removing noise from signals according to principles of the present invention.

The display 29 cycles through a series of screens during operation of the tester. A screen 350 that displays the company name as illustrated in FIG. 8b. Inquiry screens 351, 352, and 353 (illustrated in FIGS. 8c, 8d, and 8e) request the user to enter various types of information. A battery image 362 increases or decreases with the CCA rating. The battery testing screen 354 is illustrated in FIG. 8f with the sinusoidal waveform 364 in the battery 363 moving during testing. FIG. 8g illustrates a results screen 355 indicating that the battery is good. FIG. 8h illustrates a screen 356 having a printer image 365 indicating that the printer is printing. FIG. 8i and 8j illustrate two screens 357 and 358 showing the battery state of charge. FIG. 8k is a screen 359 showing a battery image 366 that the battery is operational while FIGS. 8l and 8m illustrate screens 360 and 361 having images 367 and 368, respectively, showing the battery is defective and needs to be replaced.

The microprocessor 10 may be configured in the field at any time by the bi-directional serial port 30. The serial port 30 is also used to reprogram the memory units. A power supply 31 powers all components in the system.

Figure 5:
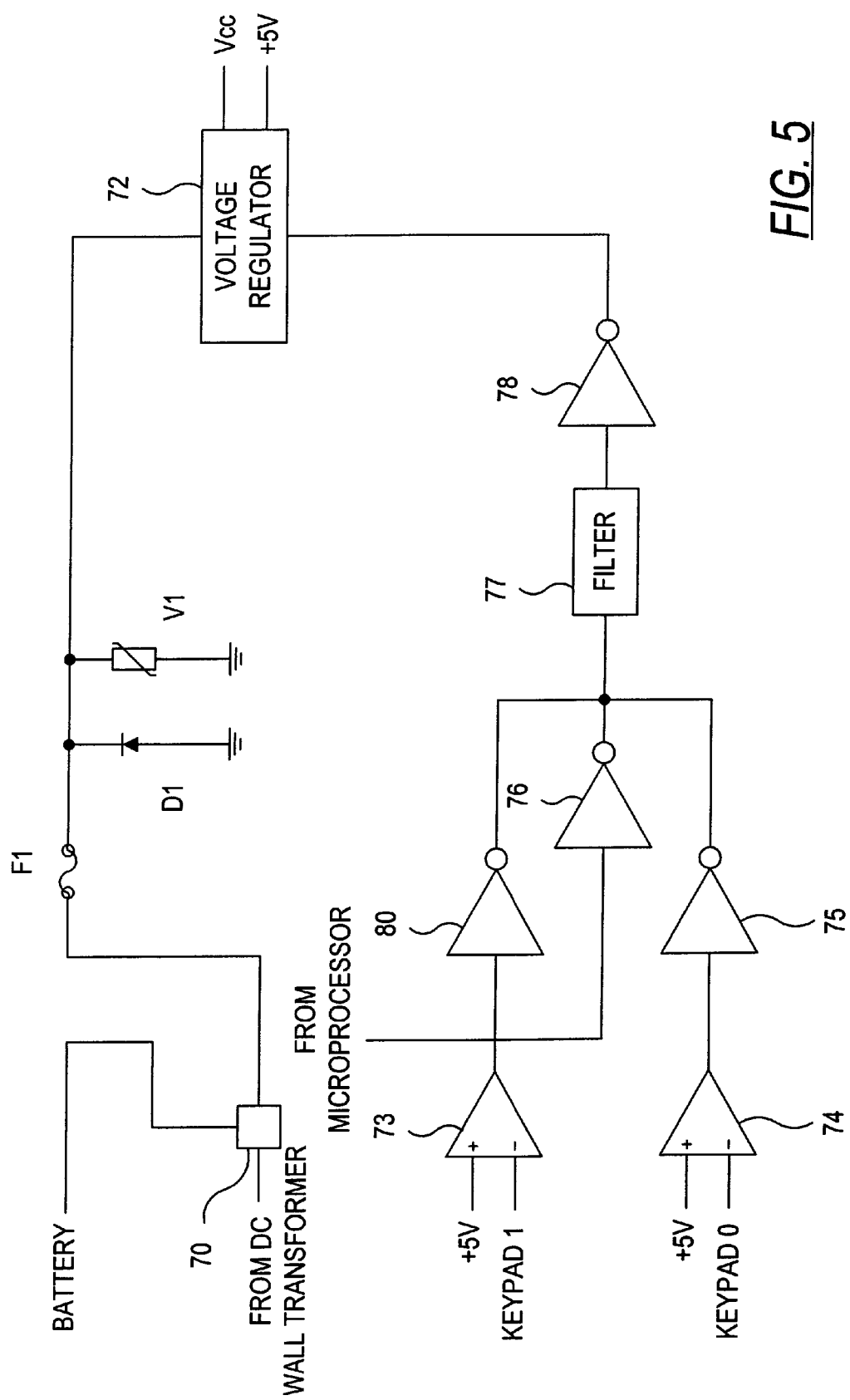
FIG. 5 is a circuit diagram of a power supply according to principles of the present invention.

Referring now to FIG. 5, a voltage signal from the battery and voltage from a DC wall transformer pass through a switch 70. The switch 70 selects which power source (battery or DC wall transformer) to use. The supply current passes through a fuse F1 which is a resettable fuse trips under high currents, then resets after allowing for a period to reset. A diode D1 prevents damage to the tester if the leads connected to the battery are reverse-connected. A varistor V1 protects the power circuit from unexpected current surges. The current waveform then enters a voltage regulator 72 which provides a voltage of +5 volts and a voltage of $V_{cc}$. The voltage $V_{cc}$ can be switched on and off, as needed.

If, after a shutdown of the system, the system may be forced up by touching any key on the keypad. A signal, Keypad 1, indicates if any of one-half the keys on the keypad has been pressed and is connected to a comparator 73. A keypad signal Keypad 0 indicates whether any of the other half of the keys on the keypad have been pressed and is connected to a comparator 74. The outputs of the comparators 73 and 74 are connected to inverters 80 and 75 which are used to polarize the signal correctly. A signal from the microprocessor 10 is also needed to re-power the system and is input through an inverter 76. The outputs of the inverters 75, 76, and 80 are coupled together and are input through a filter 77 which provides a delay until the microprocessor signal arrives.

Referring again to FIG. 1, the tester is powered by the battery under test. An external power jack is provided to allow the user to power the tester from a wall transformer when uploading or downloading information to and from the tester. The voltage across the battery is sampled by using a test clip whose twin positive and twin negative leads (and contacts) are insulated from each other. That is, the positive electrical lead (and contact) attaching the output of the driver 15 to the battery 21 is insulated from the positive electrical lead (and contact) connecting the output of the battery 21 to the instrumentation amplifier 23. The voltage value is stored in the nonvolatile storage 24.

Figure 6A:
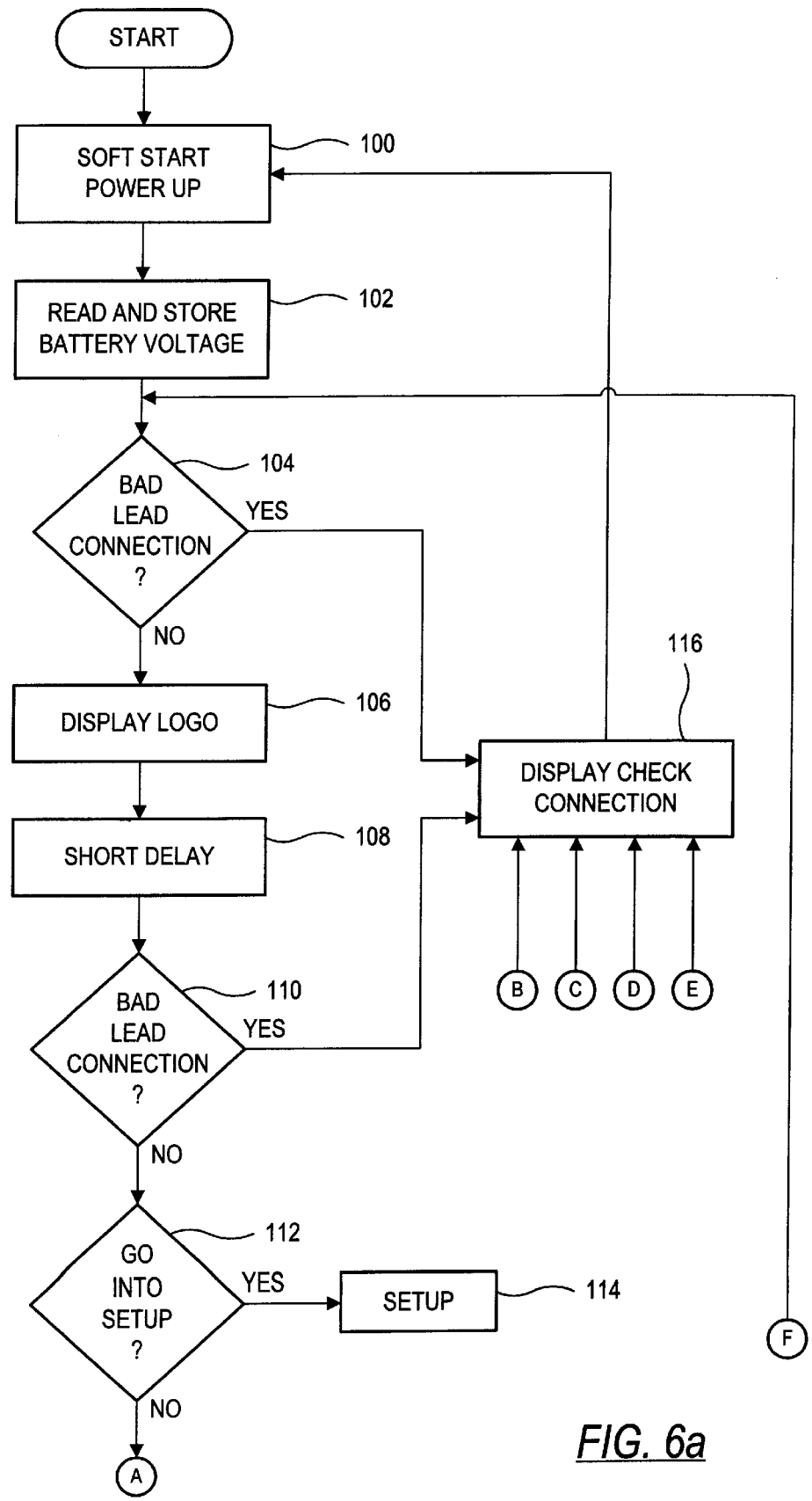
FIGS. 6a–c comprise a flow chart describing the operation of the battery tester system according to principles of the present invention.
Figure 6B:
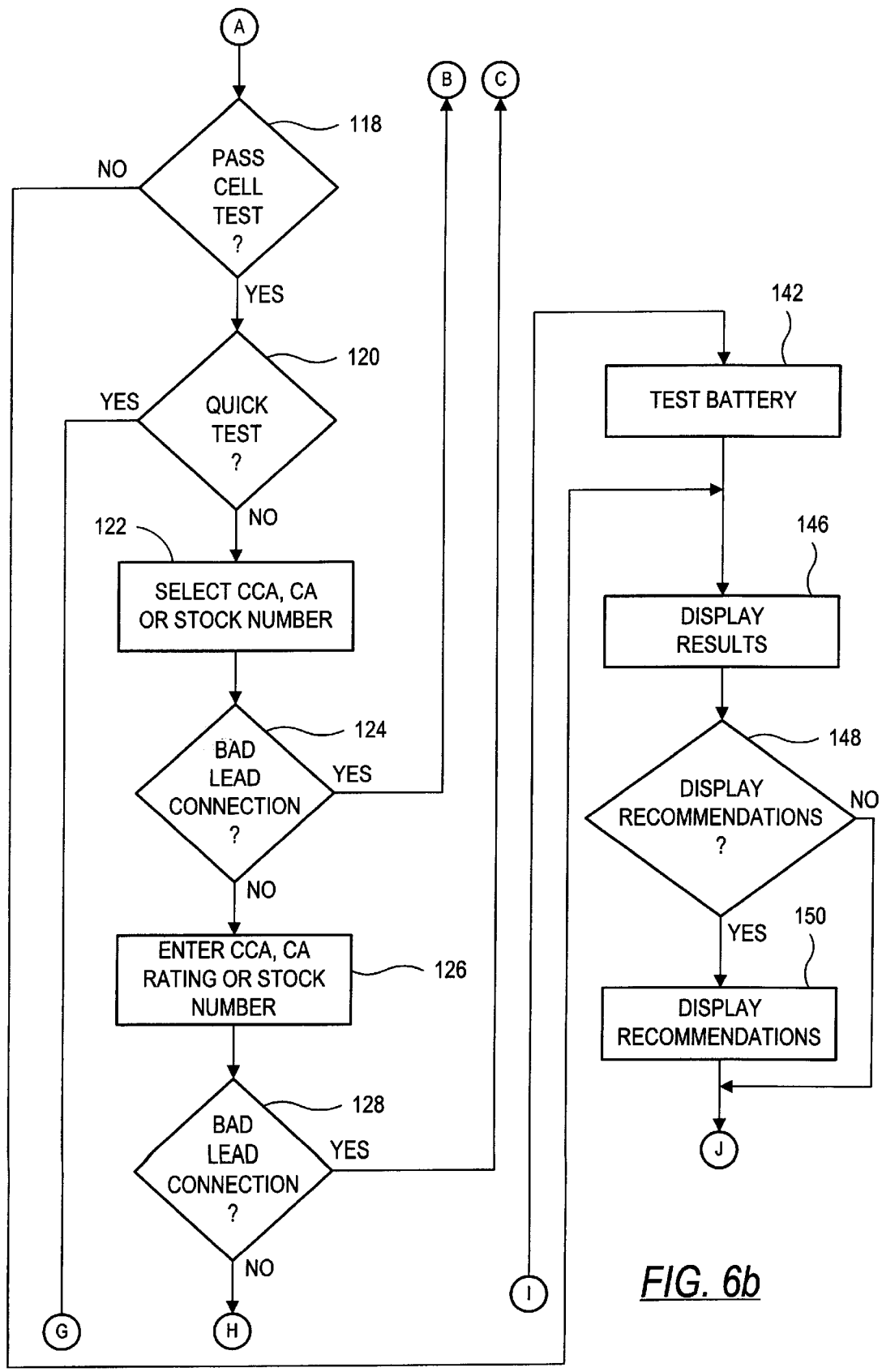
Figure 6C:
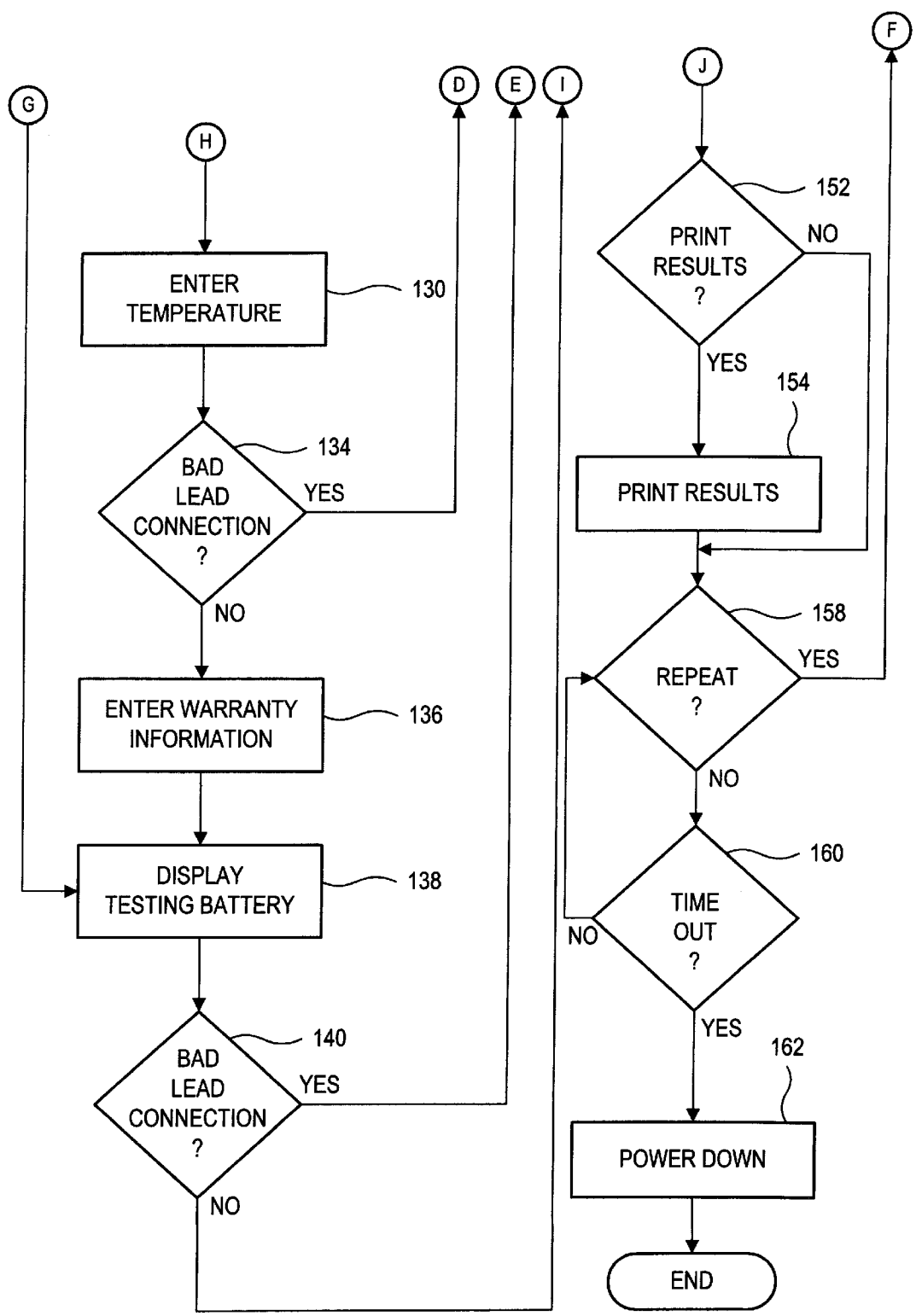

Referring now to FIG. 6, when the tester is connected to a battery at step 100, a "soft start power up" occurs which reduces or eliminates the possibility of causing a spark. After powering up, the tester reads and stores the battery's voltage at step 102. Storing the battery's voltage at the beginning of the test, before the test load is applied to the battery, is important because the battery's unloaded voltage is the best indication of the battery's state of charge.

The tester uses dual contact test jaws. One contact on the jaw is used to power the tester and apply the load to the battery, while the other contact is used to measure the voltage signal from the battery. At several points throughout the test procedure, the signal from the battery is analyzed to verify that the leads are connected properly. If at any time the signal from the battery is lost, the tester will display a message telling the user to check the lead connections to the battery.

At step 104, the microprocessor determines whether a bad lead connection exists. If the answer to step 104 is affirmative, then at step 116 the tester displays "Check Connection" on the display. If the answer at step 104 is negative, then, execution continues with step 106.

At step 106 the tester will display the logo of the tester manufacturer for a few seconds at step 108. At step 110, the lead connection is again checked. If the answer at step 110 is affirmative, then execution continues at step 116. If the answer at step 110 is negative, execution continues at step 112.

At step 112, it is determined whether the user wishes to go into system setup. If the answer at step 112 is affirmative, then setup operations are performed at step 114. Setup operations include, for example, uploading and downloading data through the serial port into memory.

At step 118, the system performs a cell test on the battery. The cell test determines the actual voltage of battery being tested as well as whether or not the battery has a bad cell. No further tests will be performed on a battery that has a bad cell or is sulfated or surface charged. The voltage ranges and results of the cell test are shown in Table 1. The values in Table 1 may be adjusted as further data is collected or as battery manufacturers request or advise. In other words, if the answer to step 118 is negative, execution continues at step 146.

If the battery passes the cell test at step 118, the user has the option at step 120 of performing a quick test or the standard test. The quick test determines and reports the battery's state of charge, CCA, CA and AA. The quick test does not diagnose the battery as good or bad. If the user chooses to perform the standard test, the tester prompts the user for the battery's rating and temperature. If the battery is under warranty, the user may also enter the warranty information. The system then tests the battery and report the results to the user. The user may then have the recommendations displayed and/or the results and recommendations printed. A printout 370 of the warranty information is illustrated in FIG. 8n. As shown, the warranty information includes replacement cost, months in service, and the warranty.

If the answer to step 120 is affirmative, indicating the user wants a quick test, the program continues at step 138 where "Testing battery" is displayed. Next, at step 140, it is determined whether a bad lead connection exits. If the answer is affirmative, control continues at step 116. If the answer is negative, execution continues with step 142 where the battery is tested. Then, at step 146, the results are displayed. Execution then continues at step 148.

At step 148, it is determined whether any recommendations need be displayed. If the answer is affirmative, then at step 150 recommendations advising the user of an appropriate action to take are given. For example, these may include advising the user to check other systems in the automobile in which the battery is installed. Execution then continues at step 152. If the answer at step 148 is negative, then control passes to step 152.

At step 152, it is determined whether the results of the test need be printed. If the answer at step 152 is negative, execution continues with step 158. If the answer is positive, execution continues with step 154 where the results are printed as described above. Execution then continues at step 158.

At step 158 it is determined whether the test is to be repeated. If the answer is affirmative, then control returns to step 104 and proceeds as described above. If the answer is negative, then the microprocessor determines whether timeout occurs at step 160. If the answer at step 160 is negative, then control returns to step 158. If the answer is positive, execution continues at step 162 where the system is powered down.

If the result at step 120 is negative, indicating that the user desires a full test, at step 122 the user is prompted to selects the CCA, CA or stock number of the battery. Next, at step 124, it is determined whether a bad lead connection exists. If the answer at step 124 is affirmative, control continues at step 116. If the answer is negative, then at step 126, the user is prompted to enters the CCA or CA rating or the stock number of the battery. Then, at step 128, it is again determined whether a bad lead connection exists. If the answer is affirmative, control continues at step 116. If the answer is negative, control resumes at step 130.

At step 130, the user is prompted to enter the battery temperature. At step 134, it is again determined whether a bad lead connection exists. If the answer is affirmative, then control continues at step 116. If the answer is negative, the user is prompted to enter warranty information on the battery at step 136. Control continues at step 138 as described above.

Figure 7A:
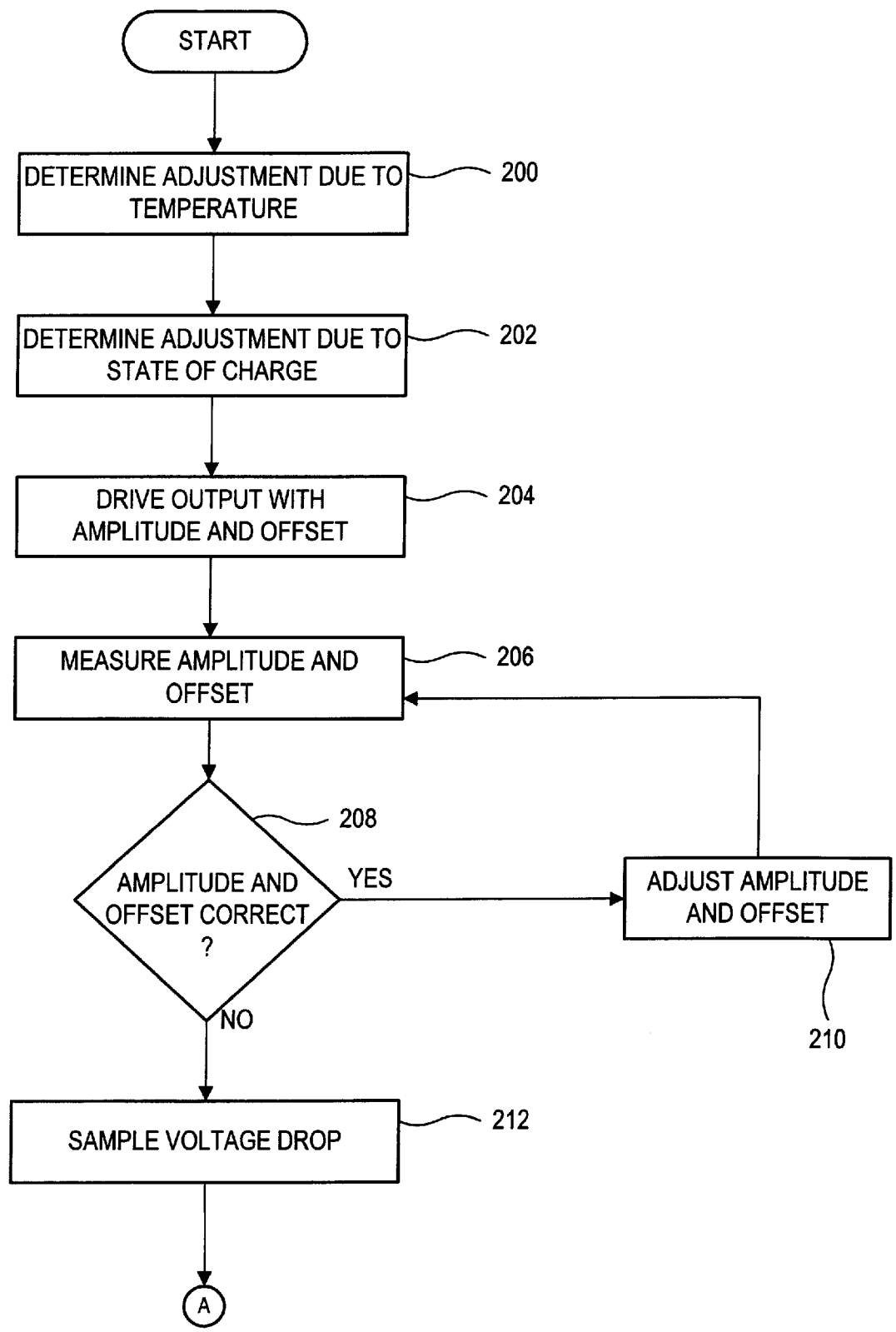
FIGS. 7a–b is a flowchart of the test step according to principles of the present invention.
Figure 7B:
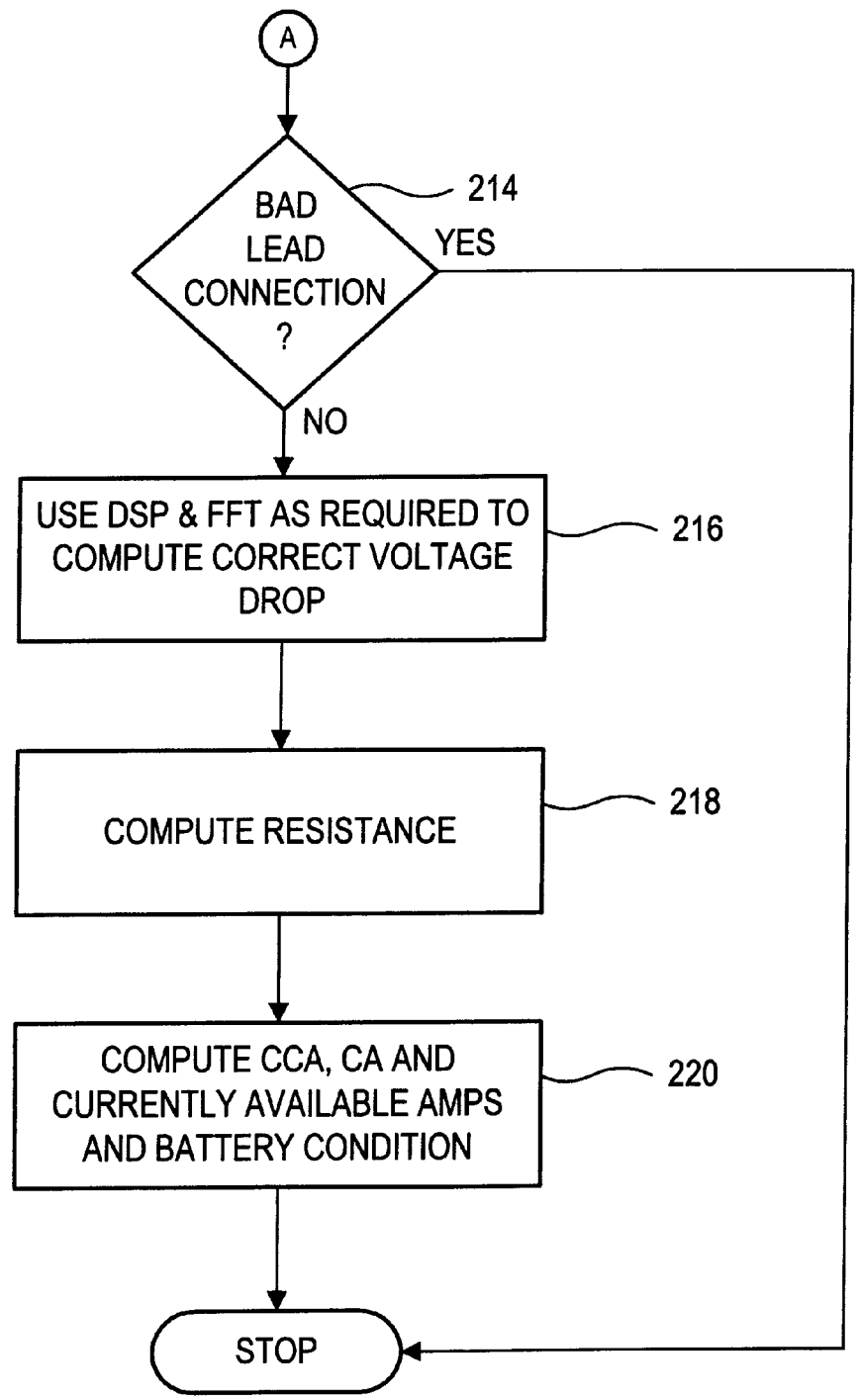

Referring now to FIG. 7, a routine for testing the battery at step 142 is illustrated. At step 200, the microprocessor determines whether any adjustments need be made based on battery temperature. Then, at step 202, the microprocessor determines whether any adjustments to the calculations need be made based on state of charge of the battery. Next, at step 204, the microprocessor drives its output and sets the first and second programmable resistors 17 and 19 to set the amplitude and offset of the current waveform, as described above. The microprocessor then measures the amplitude and offset at 206 via the analog-to-digital converter as described above. Next at step 208, the microprocessor determines whether any amplitude or offset corrections are needed via the feedback path. If the answer is affirmative, then at step

210, the microprocessor makes the corrections by adjusting the values of the first and second variable resistors. Control proceeds at step 206. If the answer to step 208 is negative, then control resumes at step 212.

At step 212 the microprocessor samples and stores the voltage drop at the output of the battery. At step 214, it is determined whether a bad lead connection exists. If the answer at step 214 is positive, then execution of this step ends. If the answer is negative, then control continues at step 216 where the microprocessor uses DSP and FFT processes to compute the correct voltage drop.

At step 218, the internal resistance R of the battery is measured by applying approximately a 1 amp peak-to-peak sinusoidal signal to the battery and measuring the voltage drop across the battery's terminals. R is then computed by Ohm's Law.

Because R is affected by the battery's level of charge and the battery's temperature, adjustments are made to the current before it is applied to the battery in order to normalize R to a battery with full charge and a temperature of 70° F. For a battery with a reduced level of charge, a reduced current is applied to the battery and for a battery with a reduced temperature (below 70° F.) a further reduced current is applied to the battery. These adjustments are made prior to applying the load to the battery to keep the signal from the loaded battery within a selected smaller range, thereby providing better resolution.

Next, at step 220, other parameters are calculated such as the CCA, CA, current available amperes of the battery, and battery condition.

The formulas for computing the CCA, CA and AA of a 12-volt lead-acid battery with temperature adjustment and charge adjustment are as follows:

CCA=3.6/R(adj)

R(adj)=V(d)/I(full) Where V(d) is the measured voltage drop with I(adj) load on or applied to the battery.

I(adj)=I(full) * M (t) * M (c)

R(bat)=V(d)/I(adj)

CA=(1/0.831) * CCA  CA is equal to CCA with an adjustment for temperature.

AA=(3.6-(12.6-V(bat)))/R(bat)

AH=CCA/6  Generally, the CCA of a battery is approximately 6 times the amp-hour rating.

The effect of temperature on a battery's resistance is estimated from the data given by the BCI, the voltage drop is increased by approximately 0.1 to 0.2 volts times approximately ⅔ per 10° F. decrease in temperature. The multiplier M(t) is the adjustment made to the current due to temperature. Table 2 illustrates values of the multiplier M(t) for a 12-volt battery.

The effect of the battery's level of charge is countered by applying a smaller current to batteries without full charge. To make this adjustment, the relationship of level of charge to the battery's resistance, normalized to full charge, is found. This relationship is found by collecting data from several different makes and sizes of batteries and then inputting the data into a table, or by fitting the data to an exponential function or a polynomial. The result is a second multiplier, M(c), such that I(adj) equals I(full) times M(t) times M(c). I(adj) is the actual current applied to the battery and it is adjusted for battery temperature and charge.

For example, the data collected from a 1000 CCA battery would lead to a multiplier M(c) as illustrated in TABLE 3, where M(c) equals the resistance at full charge divided by the resistance of the battery at the given voltage.

From the terminal voltage of the battery, the state of charge of the battery is reported. The state of charge may be displayed in a percent format or on a scale of full to empty. This relationship of state of charge to terminal voltage is set forth in the BCI manual for a 12-volt battery, as illustrated in TABLE 4.

In one illustrative test of the battery test system of the present invention, the user connected the tester to the battery. After a short delay the tester was powered up, read and stored the battery's terminal voltage, checked for good lead connections and displayed the company's logo. After a short delay, if the user did not choose to go into setup or perform a quick test, the tester prompted the user to select the battery's rating as CCA, CA, or stock number. The tester then prompted the user to enter the CCA or CA rated value or the stock number of the battery. Next, the tester prompted the user to enter the approximate temperature of the battery, and then the warranty information. Next, the tester tested the battery by determining the adjustments needed for state of charge and temperature and by applying an adjusted load to the battery. The tester measured a feedback signal to verify the amplitude and offset and made adjustments as needed. It then sampled the voltage drop signal caused by the load and used digital signal processing (DSP) to compute the correct voltage drop. From these values, the CCA, CA, AA, and AH of the battery were calculated, and the condition of the battery was determined by comparing the entered rating to the calculated ratings of the battery. The tester then displayed the results of the test, and the user had the opportunity to display recommendations and/or to print the results and recommendations to a printer interface. At the end of the test, the user could repeat the test. If the tester was left connected to the battery for several minutes without interaction from the user, the tester would automatically power down. If a key on the keypad was activated, the tester would power up and start a test sequence from the beginning.

In the above test, a battery with a terminal voltage of 12.45 volts and a temperature of 60° F. was connected to the tester. From the lookup tables, M(t) was 0.981 and M(c) was 0.89. I(full) was 1.0 amps and I(adj) was found by multiplying 1.0 amps by 0.981 by 0.89 which equaled 0.873 amps. The battery's sinusoidal amplitude of current had an amplitude of 0.873 amps and an offset of 0.873 divided by 2 which equaled 0.437 amps. With this applied load, the voltage drop measured was 5.54 mV, and R(adj) was 5.54 mV divided by 1.0 A which was 5.54 miliohms. R(bat) was 5.54 mV divided by 0.873 volts which was 6.34 miliohms. Using the formulas listed above, the CCA was computed to be 650 A, the CA 782 A, the AA 544 A, and the AH 108 A. The state of charge was 75% of full charge.

Figure 10A:
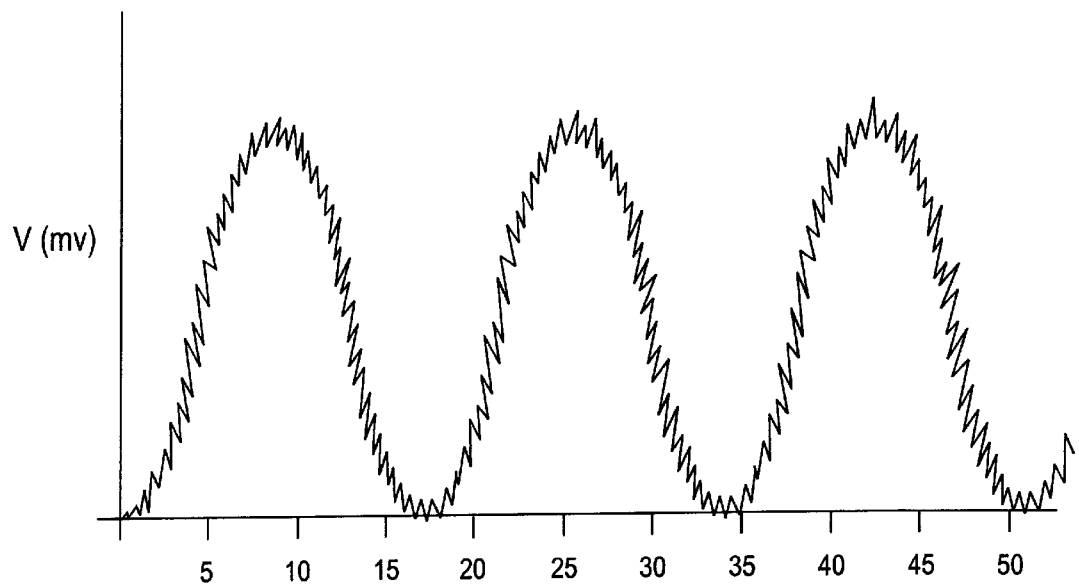
FIGS. 10a–10e are waveform diagrams which illustrate the operation of the algorithm of FIG. 9 according to principles of the present invention.
Figure 10B:
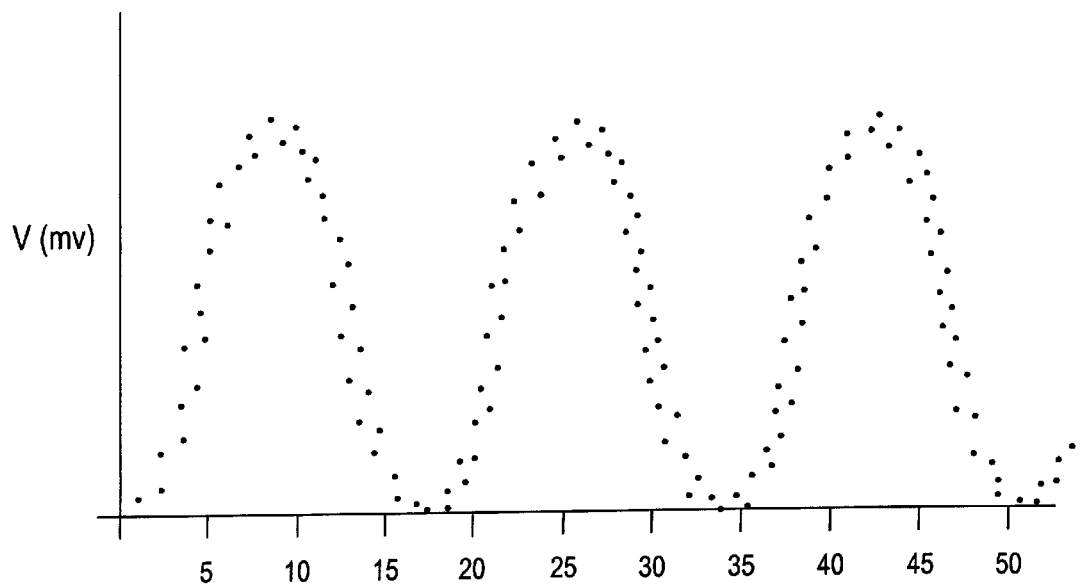
Figure 10C:
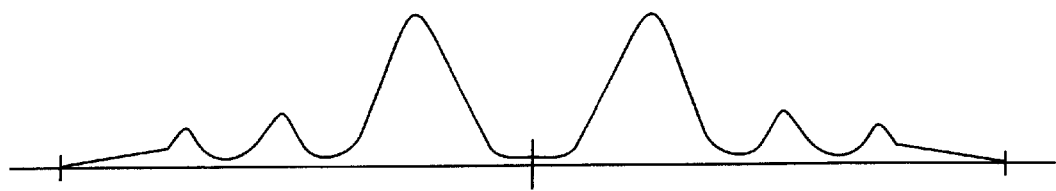
Figure 10D:
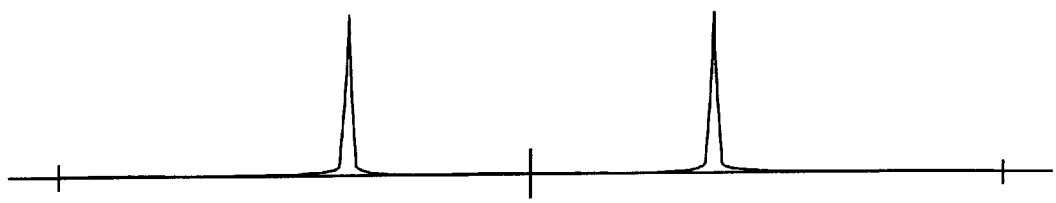
Figure 10E:
Figure 11:
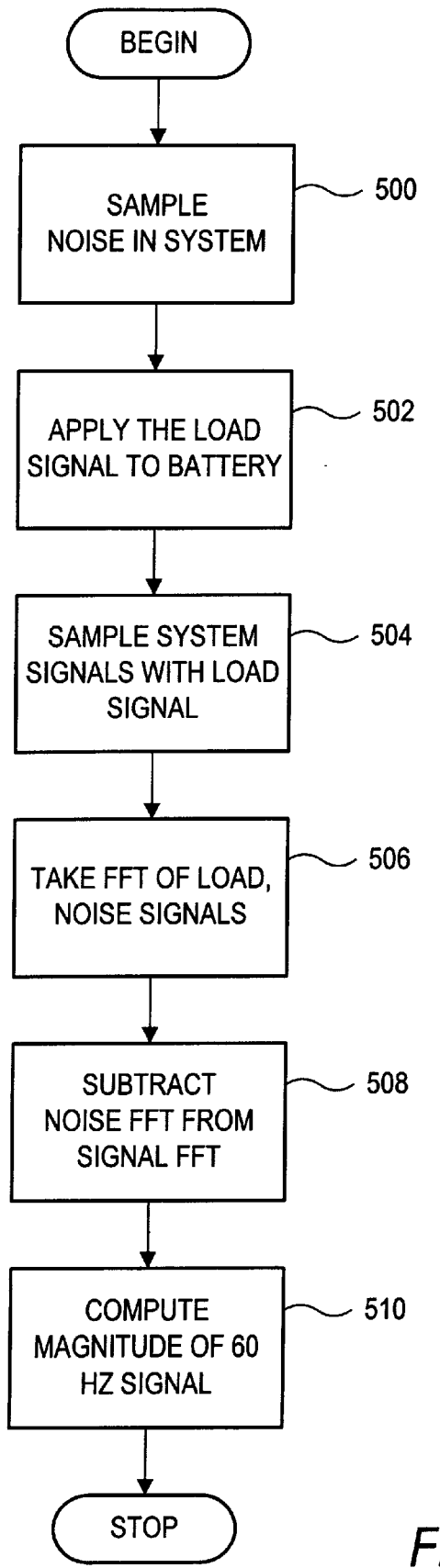
FIG. 11 illustrates a DSP algorithm for removing noise from signals according to principles of the present invention.

Referring now to FIG. 9 and FIGS. 10a–10e, one algorithm used by the microprocessor to remove noise of the return signal from the battery is described. At step 400, the microprocessor samples the voltage drop across the battery as described above. FIG. 10a illustrates the actual voltage signal of the battery. FIG. 10b illustrates the signal sampled by the microprocessor. At step 402, the microprocessor takes the fast Fourier transform (FFT) of the voltage drop. FIG. 10c illustrates the FFT of the sampled signal where the bulk of the signal is around the signal peaks and the noise is near the horizontal axis. At step 404, the microprocessor multiples the FFT taken at step 402 to an FFT taken of a 60 Hz filtered signal. The result represents the 60 Hz signal with the noise removed. Finally, the magnitude of the signal is computed at step 406 and execution of the noise-removal algorithm ends. FIG. 10d represents the FFT of the filter while FIG. 10e represents the magnitude of the calculated 60 Hz. component.

Figure 12A:
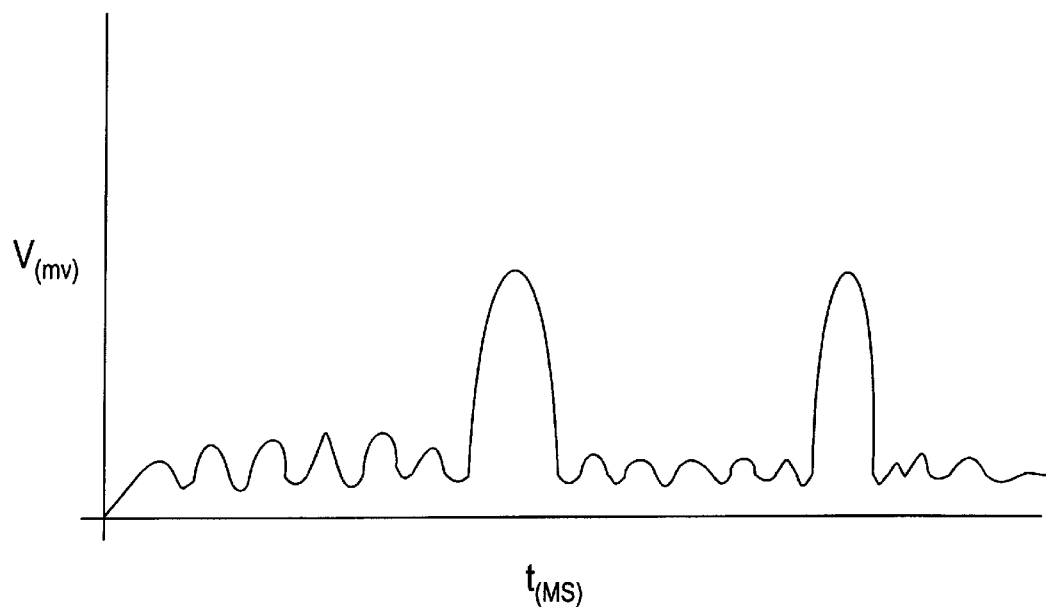
FIGS. 12a–12e are waveform diagrams which illustrate the operation of the algorithm of FIG. 11 according to principles of the present invention.
Figure 12B:
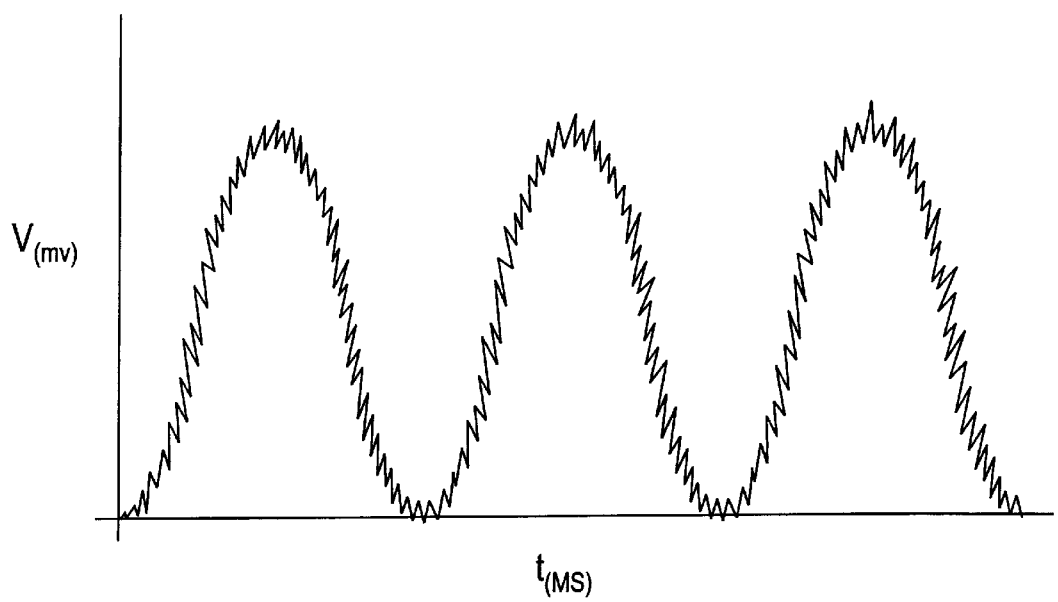
Figure 12C:
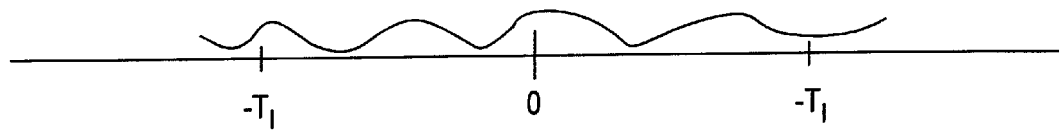
Figure 12D:
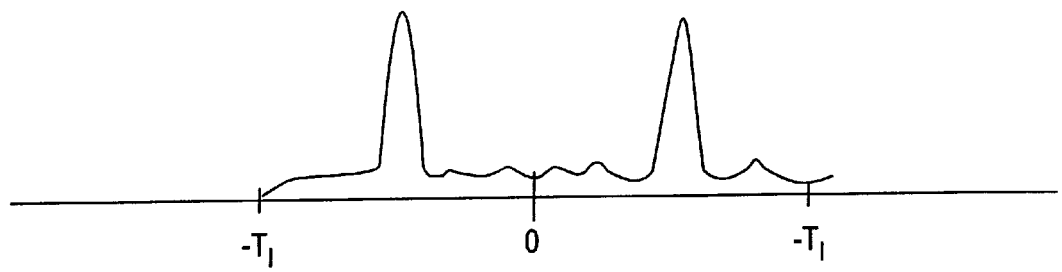
Figure 12E:
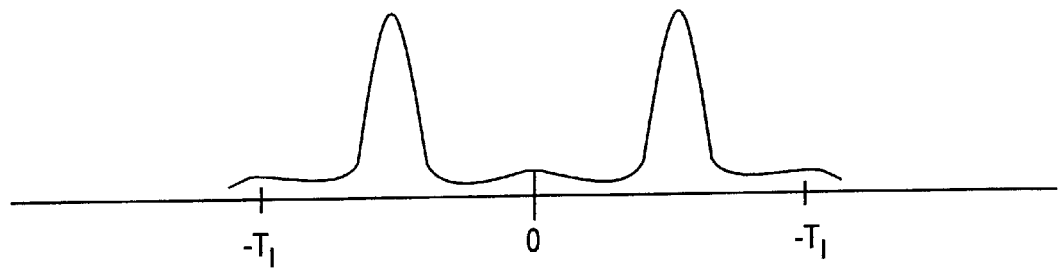

An alternative algorithm for noise removal is illustrated in FIGS. 11 and 12a–12e. At step 500, the microprocessor samples noise in the system alone without a signal applied to the battery. The noise sampled is illustrated by the waveform of FIG. 12a. Next, at step 502, the load signal is applied to the battery as described above. Next, at step 504, the system samples the signal from the battery with the load signal applied. The waveform sampled is illustrated in FIG. 12b. Next, at step 506, the microprocessor takes the FFT of the sampled signal. This FFT of the noise signal is illustrated in FIG. 12c while the FFT from the battery is illustrated in FIG. 12d Then, at step 508, the noise FFT is subtracted from the signal FFT leaving the signal without noise which is illustrated at FIG. 12e. Finally, at step 510, the system computes the magnitude of the 60 Hz signal.

Figure 13A:
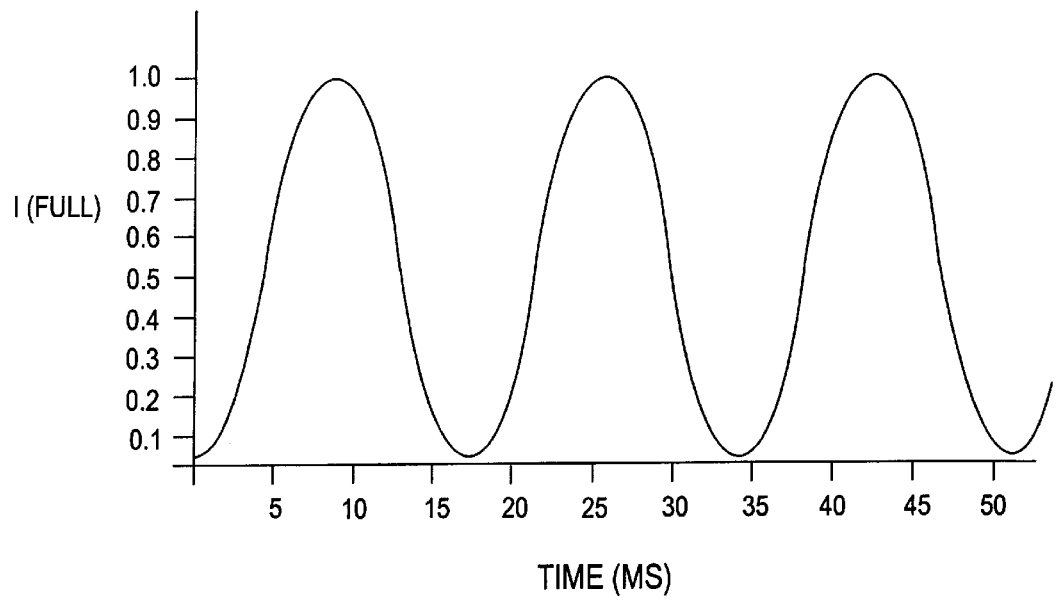
FIGS. 13a–13d illustrate voltage and current waveforms and adjustments made upon these waveforms according to principles of the present invention.
Figure 13B:
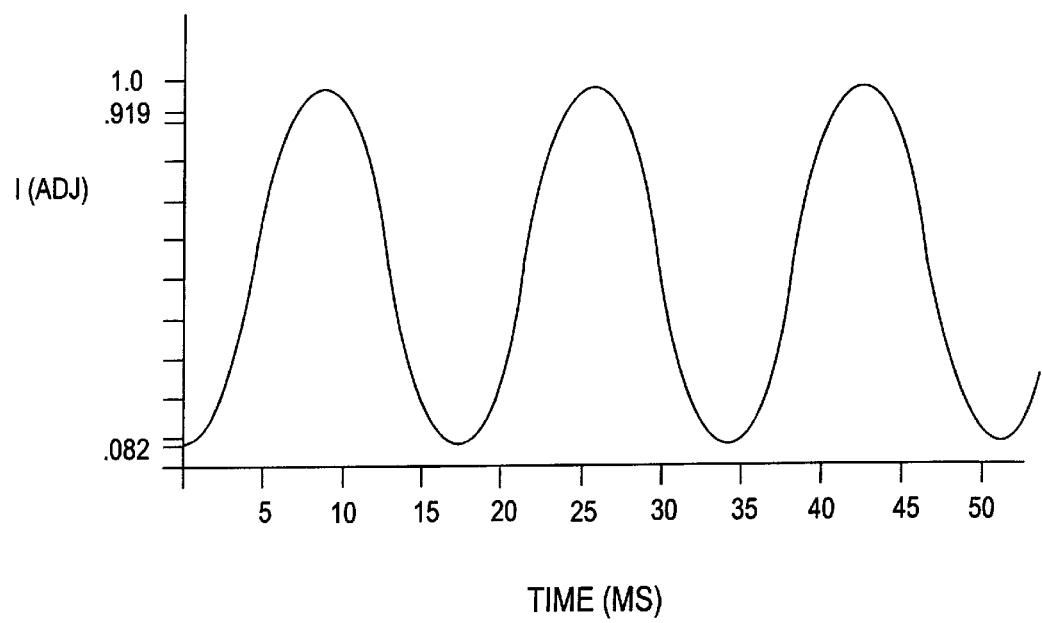
Figure 13C:
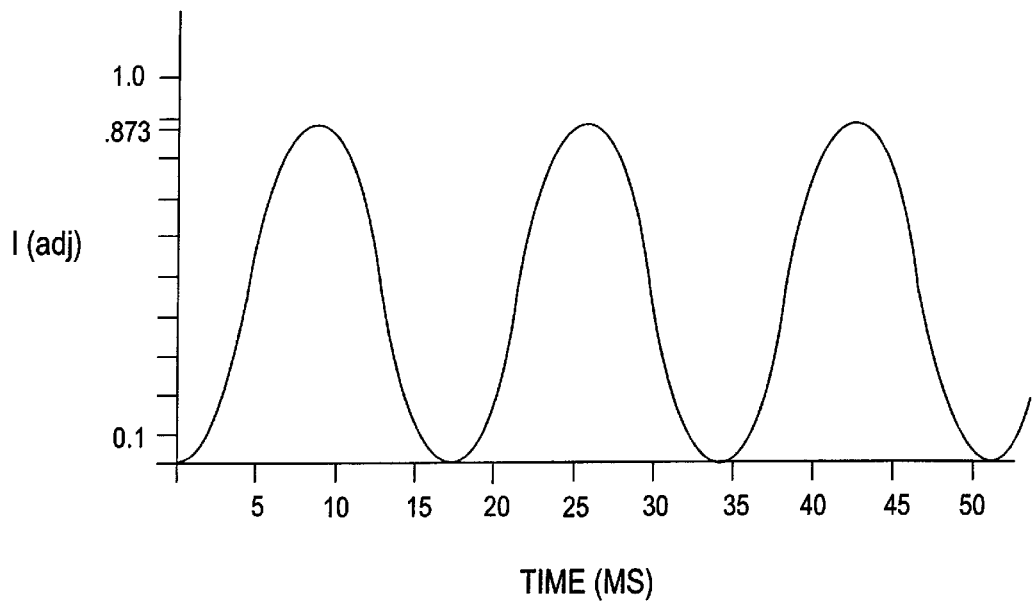
Figure 13D:
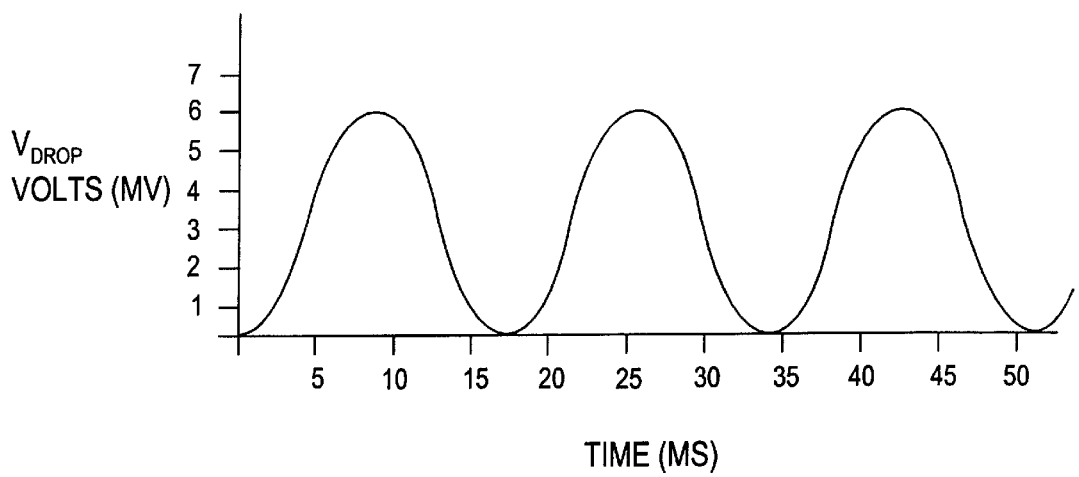

Signal waveforms present in one embodiment of the invention are illustrated in FIGS. 13a–13d. As shown in FIG. 13a, I(full) was a 1 ampere peak-to-peak sine wave with a frequency of 60 Hz and an offset of 0.5 amps. I(adj) is illustrated in FIG. 13b but is riding on an excessive DC level. I(adj) comprises a 0.873 amp peak-to-peak sinusoidal waveform. FIG. 13c illustrates the I(adj) has been adjusted to take into account the excessive DC level and is centered at 0.437 amps. Finally, FIG. 13d illustrates the voltage drop across the battery due to the applied load. This voltage drop represents the AC voltage measured at the instrumentation amplifier.

Thus, a battery tester is provided where the test signals are initiated, shaped, and controlled by a microprocessor. A tester is also provided where the value of the battery's resistance does not affect subsequent measurements of that resistance. That is, the battery tester performs all corrections and adjustments to the signal sent to the battery under test before the actual test signal is sent to the battery. The signal that returns to the battery and is directly proportional to the battery's resistance at full charge and 70° F. and need not be corrected. The testing system described above is also easy to use and maintain requiring a minimum number of inputs from the user.

While the present invention has been described with reference to one or more particular embodiments, those skilled in the art will recognize that many changes may be made thereto without departing from the spirit and scope of the present invention, which is set forth in the following claims.

I claim:

1. A system for determining the operating characteristics of a battery, said system comprising:

active controller means for generating and shaping a time-varying current signal which is adjustable over time for application to said battery wherein said controller means adjusts the shape of said time varying signal based on the operating characteristics of said battery;

conversion means for receiving from said battery a time-varying return voltage signal and for converting said time-varying return voltage signal into a digital signal, the amplitude of said time-varying return voltage signal being representative of the operating characteristics of said battery, said time-varying return voltage signal being produced in response to said time-varying voltage signal;

said controller means being responsive to said digital signal for determining the operating characteristics of said battery, said controller means generating display signals representative of the operating characteristics of said battery; and display means coupled to said controller means for displaying a result represented by said display signals.

2. The system of claim 1 wherein said operating characteristics include the temperature of said battery and the state of charge of said battery.

3. The system of claim 1 further including noise removal means for removing noise from said return signal.

4. The system of claim 1 wherein said time-varying voltage signal is a sinusoidal waveform.

5. The system of claim 1 further comprising a printer for printing warranty data concerning said battery.

6. The system of claim 1 wherein said display means includes a dot matrix graphics display for displaying information concerning the condition of said battery.

7. The system of claim 1 wherein said controller means comprises:

a microprocessor for generating a series of digital pulses;

a passive filter serially connected to said microprocessor for creating said time-varying voltage signal from said series of digital pulses;

an amplifier serially connected to said passive filter for providing a DC offset and fixed amplification factor to said time-varying voltage signal;

calibration means actuated by said microprocessor and connected to said amplifier, said calibration means being responsive to said microprocessor for adjusting the amplitude of said time-varying voltage signal; and driver means serially connected to said amplitude control means for supplying said time-varying voltage signal to said battery.

8. The system of claim 7 wherein said calibration means comprises a programmable resistor, said programmable resistor having an adjustable value controlled by said microprocessor.

9. The system of claim 8 further comprising a keypad coupled to said microprocessor for supplying battery operational information, said microprocessor adjusting said adjustable resistor in response to said operational information.

10. A system for determining the operating characteristics of a battery, said system comprising:

active controller means for generating, shaping, and calibrating a time-varying current signal for application to said battery, said signal adjustable over time;

means for receiving battery operational information from a user and adjusting said time-varying signal in accordance with said battery operational information;

conversion means for receiving from said battery a time-varying return voltage signal and for converting said time-varying return voltage signal into a digital signal, the amplitude of said time-varying return signal containing information representative of the operating characteristics of said battery, said time-varying return voltage signal being produced in response to said time-varying voltage signal;

said controller means being responsive to said digital signal for determining the operating characteristics of said battery and generating display signals containing information representative of the operating characteristics of said battery; and a graphic display coupled to said controller means for displaying said information contained in said display signals.

11. The system of claim 10 wherein said controller means comprises:

a microprocessor for generating a series of digital pulses;

a passive filter serially connected to said microprocessor for creating said time-varying voltage signal from said series of digital pulses;

amplifier means serially connected to said passive filter, said amplifier providing a DC offset and fixed amplification factor to said time-varying voltage signal; and a driver serially connected to said amplifier means for supplying said time-varying voltage signal to said battery.

12. A system for determining the operating characteristics of a battery, said system comprising:

a keypad for receiving operating characteristic information from a user;

a microprocessor coupled to said keypad for generating and shaping a time-varying current signal which is adjustable over time for application to said battery based upon said received operating characteristic information;

conversion means coupled to said battery and microprocessor for receiving from said battery a time-varying return voltage signal and for converting said time-varying return voltage signal into a digital signal, the amplitude of said time-varying return signal containing information representative of the operating characteristics of said battery, said time-varying return voltage signal being produced in response to said time-varying voltage signal;

said microprocessor being responsive to said digital signal for determining the operating characteristics of said battery, said controller means generating display signals, said display signals including information representative of the operating characteristics of said battery, said controller means further comprising noise removal means for removing noise from said return signal; and display means for displaying information from said display signals.

13. The system of claim 12 wherein said controller means comprises:

a passive filter serially connected to said microprocessor for creating said time-varying voltage signal from said series of digital pulses;

an amplifier serially connected to said passive filter for providing a DC offset and fixed amplification factor to said time-varying voltage signal;

amplitude control means connected to said microprocessor and serially connected to said amplifier, said amplitude control means responsive to said microprocessor for adjusting the amplitude of said time-varying voltage signal;

driver means serially connected to said amplitude control means for supplying said time-varying voltage signal to said battery; and and wherein said microprocessor generating a series of digital pulses.

14. The system of claim 13 wherein said amplitude control means comprises a programmable resistor being actuated by said microprocessor.

15. The system of claim 13 further comprising a printer for printing warranty data concerning said battery.

16. A method for determining the operating characteristics of a battery, said method comprising the steps of:

providing operating characteristic information for a battery to be tested;

generating and shaping a time-varying current signal for application to said battery in response to said operating characteristic information, said signal adjustable over time;

receiving from said battery a time-varying return voltage signal produced in response to said time-varying voltage signal;

converting said time-varying return voltage signal into a digital signal, the amplitude of said time-varying return signal containing information representative of the operating characteristics of said battery;

determining the operating characteristics of said battery in response to said return signal;

removing noise from said return signal;

generating display signals representative of the operating characteristics of said battery; and displaying a result represented by said display signals.

17. The method of claim 16 wherein said step of receiving operational characteristic information from a battery comprises receiving a battery CCA and temperature.

18. The method of claim 17 wherein said step of removing noise comprises:

sampling the voltage drop across the battery;

taking a fast Fourier transform (FFT) of said voltage drop;

multiplying the FFT of a 60 Khz signal by the FFT of the voltage drop; and computing the magnitude of the resultant signal.

19. The method of claim 16 wherein said step of removing noise comprises:

sampling the noise voltage signal across said battery taking a fast Fourier transform (FFT) of said noise voltage signal;

sampling the battery voltage;

taking the FFT of said battery voltage signal;

creating a true voltage signal by subtracting the FFT of the noise signal from the FFT of the battery voltage signal; and computing the magnitude of said true voltage signal.

* * * * *